(12) United States Patent
Furuya et al.

(10) Patent No.: US 7,231,321 B2
(45) Date of Patent: Jun. 12, 2007

(54) METHOD OF RESETTING SUBSTRATE PROCESSING APPARATUS, STORAGE MEDIUM STORING PROGRAM FOR IMPLEMENTING THE METHOD, AND SUBSTRATE PROCESSING APPARATUS

(75) Inventors: Hajime Furuya, Nirasaka (JP); Hideki Tanaka, Nirasaki (JP); Tomoya Okubo, Nirasaki (JP); Ryoko Kobayashi, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 11/270,775

(22) Filed: Nov. 10, 2005

(65) Prior Publication Data
US 2006/0100825 A1    May 11, 2006

Related U.S. Application Data

(60) Provisional application No. 60/635,619, filed on Dec. 14, 2004.

(30) Foreign Application Priority Data
Nov. 10, 2004    (JP)    ............... 2004-327076

(51) Int. Cl.
*G06F 11/30* (2006.01)
*G21C 17/00* (2006.01)
(52) U.S. Cl. .................................... 702/185
(58) Field of Classification Search ............. 702/185
See application file for complete search history.

(56) References Cited

U.S. PATENT DOCUMENTS

| 5,981,399 | A  | * | 11/1999 | Kawamura et al. | ......... | 438/715 |
| 7,054,786 | B2 | * | 5/2006 | Sakano et al. | .............. | 702/183 |
| 2003/0045098 | A1 | * | 3/2003 | Verhaverbeke et al. | ..... | 438/689 |
| 2004/0254761 | A1 | | 12/2004 | Sakano et al. | | |

FOREIGN PATENT DOCUMENTS

| JP | 2002-18274 | | 1/2002 |
| JP | 2002-018274 | * | 1/2002 |

* cited by examiner

*Primary Examiner*—John Barlow
*Assistant Examiner*—Cindy D. Khuu
(74) *Attorney, Agent, or Firm*—Oblon, Spivak, McClelland, Maier & Neustadt, P.C.

(57) ABSTRACT

A method of resetting a substrate processing apparatus having a chamber which is capable of carrying out abnormality judgment on the substrate processing apparatus accurately without causing a decrease in the utilization ratio of the substrate processing apparatus. The chamber is evacuated. A temperature in the chamber is set. Whether or not there is an abnormality in the chamber is judged. An atmosphere in the chamber is stabilized so as to conform to predetermined processing conditions. At least one selected from data that change in response to a change in a state inside the chamber is measured. The measured data is compared with reference data that corresponds to the measured data for a normal state in the chamber.

16 Claims, 14 Drawing Sheets

METHOD OF RESETTING SUBSTRATE PROCESSING APPARATUS, STORAGE MEDIUM STORING PROGRAM FOR IMPLEMENTING THE METHOD, AND SUBSTRATE PROCESSING APPARATUS

BACKGROUND OF THE INVENTION

1. Field of the Invention

The present invention relates to a method of resetting a substrate processing apparatus, a storage medium storing a program for implementing the method, and a substrate processing apparatus, and in particular relates to a method of resetting a substrate processing apparatus after maintenance, and a storage medium storing a program for implementing the method.

2. Description of the Related Art

Generally, a substrate processing system that carries out predetermined processing such as film formation or etching on semiconductor wafers (hereinafter referred to as "wafers") as substrates is comprised of a processing chamber (substrate processing apparatus, hereinafter referred to as "P/C") in which a wafer is housed and subjected to the predetermined processing, an atmospheric system transferring apparatus that removes wafers from a wafer cassette, which is a sealed container housing a predetermined number of wafers, and a load lock chamber that is disposed between the atmospheric system transferring apparatus and the P/C and transfers wafers in and out between the atmospheric system transferring apparatus and the P/C.

In such a substrate processing system, the P/C has a cylindrical chamber (hereinafter referred to as "chamber"), a wafer being subjected to the desired processing such as etching in the chamber using a plasma or the like. However, the plasma in the chamber during the etching does not only etch the wafer, but also causes wear of component parts of the chamber, and furthermore causes production of reaction products such as a deposit. The reaction products become attached to surfaces of component parts, and hence every time a predetermined processing time period has elapsed, it is necessary to open a lid that separates the inside of the chamber from the outside, and carry out maintenance such as replacing worn out component parts in the chamber or cleaning component parts on which reaction products have become attached. Once the maintenance has been completed, the lid is closed, and resetting work involving reducing the pressure in the chamber and so on is carried out on the P/C.

During the P/C resetting work, the state of transfer of wafers and the wafer surface etch rate are checked. In the case, for example, that the etch rate exhibits an abnormal value, it is necessary to carry out a chamber leakage check, or open the lid of the chamber and recheck inside the chamber, checking for example whether or not a component part is missing or out of place, whether or not there is a component part installation defect, or whether or not there is a component part cleaning defect. There has thus been a problem that the P/C resetting work takes much time.

In recent years, there has thus been developed a method in which, because the state of plasma generation in the chamber becomes unstable if a component part installation defect arises in the chamber, the output of a high-frequency power source that applies high-frequency electrical power in the chamber is monitored so as to detect abnormalities in the P/C. In this method, it is detected whether the high-frequency power source has reached a stable state by comparing results of multivariate analysis on a plurality of types of measured data for the high-frequency power source measured when the state of application of the electrical power by the high-frequency power source has become stable (hereinafter referred to as the "normal model") with results of multivariate analysis on the same measured data measured upon start-up of the P/C (see, for example, Japanese Laid-open Patent Publication (Kokai) No. 2002-18274).

According to this method, mistakes in the installation of component parts in the chamber and so on can be detected without opening the lid of the chamber, and hence compared with conventional P/C resetting work, the time required for resetting the P/C can be reduced.

However, according to the method described above, in which the output of the high-frequency power source is monitored so as to detect abnormalities in the P/C, multivariate analysis must be carried out. A method of selecting the measured data to be used in the normal model has not been established, and hence there is a problem that when setting thresholds for comparison, universality of the normal model cannot be secured, and the P/C abnormality judgment cannot be carried out accurately.

Moreover, in the multivariate analysis, each piece of measured data is standardized, and hence the multivariate analysis results are not absolute values. When setting a given multivariate analysis result as a threshold, because the multivariate analysis result is not an absolute value, it is difficult for workers to understand the effect that a variation in the measured data will have on the multivariate analysis results. As a result, there is a problem that the workers' subjectivity enters into the setting of thresholds, and hence again the universality of the normal model cannot be secured, and the P/C abnormality judgment cannot be carried out accurately.

Furthermore, the environment in the chamber changes between before and after maintenance, and hence the normal model must be reset every time maintenance is carried out. There is a problem that this takes much time, and hence a decrease in the utilization ratio of the P/C still cannot be prevented.

SUMMARY OF THE INVENTION

It is an object of the present invention to provide a method of resetting a substrate processing apparatus, a storage medium storing a program for implementing the method, and a substrate processing apparatus, which are capable of carrying out abnormality judgment on the substrate processing apparatus accurately without causing a decrease in the utilization ratio of the substrate processing apparatus.

To attain the above object, in a first aspect of the present invention, there is provided a method of resetting a substrate processing apparatus having a chamber, the method comprising an evacuating step of evacuating the chamber, a temperature setting step of setting a temperature in the chamber, an abnormality judgment step of judging whether or not there is an abnormality in the chamber, and a seasoning step of stabilizing an atmosphere in the chamber so as to conform to predetermined processing conditions, wherein the abnormality judgment step comprises measuring at least one selected from data that change in response to a change in a state inside the chamber, and comparing the measured data with reference data that corresponds to the measured data for a normal state in the chamber.

According to the construction of the first aspect described above, in the abnormality judgment, at least one selected from data that change in response to a change in the state inside the chamber is measured, and the measured data is compared with reference data that corresponds to the measured data for a normal state in the chamber. That is, the abnormality judgment is carried out based on data that changes in response to a change in the state inside the chamber, without using results of multivariate analysis. The abnormality judgment for the substrate processing apparatus can thus be carried out accurately. Moreover, there is no need to reset a normal model every time maintenance is carried out. The utilization ratio of the substrate processing apparatus can thus be prevented from decreasing.

Preferably, in the temperature setting step, the temperature in the chamber is set to a temperature different to a temperature in the chamber during ordinary substrate processing.

According to the construction of the first aspect described above, in the temperature setting, the temperature in the chamber is set to a temperature different to the temperature in the chamber during ordinary substrate processing. As a result, the atmosphere in the chamber can be made to conform to processing conditions enabling only the minimum substrate processing accuracy required in the resetting of the substrate processing apparatus to be secured. The resetting of the substrate processing apparatus can thus be carried out quickly.

Preferably, in the abnormality judgment step, a processing gas that does not cause production of a reaction product in the chamber is introduced while a substrate in the chamber is subjected to a predetermined process.

According to the construction of the first aspect described above, in the abnormality judgment, a processing gas that does not cause production of a reaction product in the chamber is introduced during substrate processing. As a result, a reaction product is not deposited in the chamber during resetting of the substrate processing apparatus, and hence transition to ordinary substrate processing after the resetting of the substrate processing apparatus can be carried out smoothly.

More preferably, the processing gas comprises only oxygen.

According to the construction of the first aspect described above, the gas introduced into the chamber during the abnormality judgment comprises only oxygen. As a result, production of a reaction product in the chamber can be prevented reliably.

Preferably, the measured data comprises a log showing a state of at least one component part of the substrate processing apparatus.

According to the construction of the first aspect described above, the measured data comprises a log showing a state of at least one component part of the substrate processing apparatus. As a result, the measured data can be obtained simultaneously with the processing, and hence the abnormality judgment can be carried out quickly.

More preferably, the log is of an impedance of a matcher that adjusts high-frequency electrical power applied to a lower electrode disposed in the chamber.

According to the construction of the first aspect described above, the log used as the measured data is of the impedance of a matcher that adjusts high-frequency electrical power applied to a lower electrode disposed in the chamber. The impedance of the matcher changes in accordance with the state of plasma generation in the chamber. The abnormality judgment for the substrate processing apparatus can thus be carried out reliably.

Alternatively, the log is of a voltage between a lower electrode disposed in the chamber and a matcher that adjusts high-frequency electrical power applied to the lower electrode.

According to the construction of the first aspect described above, the log used as the measured data is of the voltage between a lower electrode disposed in the chamber and a matcher that adjusts high-frequency electrical power applied to the lower electrode. The voltage changes in accordance with the state of plasma generation in the chamber. The abnormality judgment for the substrate processing apparatus can thus be carried out reliably.

Alternatively, the log is of an opening extent of a control valve that controls a pressure in the chamber.

According to the construction of the first aspect described above, the log used as the measured data is of the opening extent of a control valve that controls the pressure in the chamber. The opening extent changes in accordance with the state of plasma generation in the chamber. The abnormality judgment for the substrate processing apparatus can thus be carried out reliably.

Preferably, the measured data is processed substrate light emission data.

According to the construction of the first aspect described above, the measured data is processed substrate light emission data. The light emission data can be measured easily, and moreover changes in accordance with the state of plasma generation in the chamber. The abnormality judgment for the substrate processing apparatus can thus be carried out reliably, without causing a decrease in the utilization ratio of the substrate processing apparatus.

More preferably, the light emission data relates to a light intensity ratio.

According to the construction of the first aspect described above, the light emission data used as the measured data relates to a light intensity ratio. The light intensity ratio is dimensionless, and hence there is no effect from the magnitude of light intensities used in calculation of the light intensity ratio. The abnormality judgment for the substrate processing apparatus can thus be carried out accurately.

Preferably, the measured data is data relating to a high-frequency power source that supplies high-frequency electrical power applied to a lower electrode disposed in the chamber.

According to the construction of the first aspect described above, the measured data is data relating to a high-frequency power source that supplies high-frequency electrical power applied to a lower electrode disposed in the chamber. As a result, the data can be measured easily, and hence the abnormality judgment can be carried out easily.

Preferably, in the evacuating step, the temperature in the chamber is raised.

According to the construction of the first aspect described above, in the evacuation, the temperature in the chamber is raised. By raising the temperature in the chamber, evaporation of moisture that has become attached to component parts of the chamber is promoted. The resetting of the substrate processing apparatus can thus be carried out quickly.

Preferably, in the seasoning step, stability of the atmosphere in the chamber is detected based on a difference in light emission data between two consecutively processed substrates.

According to the construction of the first aspect described above, in the seasoning, the stability of the atmosphere in the chamber is detected based on the difference in light emission data between two consecutively processed substrates. Once the atmosphere in the chamber has become stable, the amount of light emitted from the substrates also stops varying and becomes stable. Judgment of the stability of the atmosphere in the chamber can thus be carried out easily based on the difference in light emission data between two consecutively processed substrates as described above.

More preferably, in the seasoning step, the stability of the atmosphere in the chamber is detected based on a derivative of the difference in the light emission data.

According to the construction of the first aspect described above, in the seasoning, the stability of the atmosphere in the chamber is detected based on the derivative of the difference in the light emission data between two consecutively processed substrates. The derivative of the difference in the light emission data can decrease affection by the magnitude of the variation of the light intensity. The judgment of the stability of the atmosphere in the chamber can thus be carried out more accurately.

Preferably, in the abnormality judgment step, a leak in the chamber is detected based on a ratio of light emission amounts at different wavelengths for light emission from a processed substrate.

According to the construction of the first aspect described above, in the abnormality judgment, a leak in the chamber is detected based on a ratio of light emission amounts at different wavelengths for light emission from a processed substrate. If a leak occurs in the chamber, then gas flows in from the outside, and the state of light emission by the plasma changes in accordance with the type of the gas. Moreover, the ratio of light emission amount is dimensionless, and hence there is no effect from the magnitude of the light emission amount at each of the wavelengths used in calculation of the ratio of light emission amount. The abnormality judgment for the substrate processing apparatus can thus be carried out more accurately.

To attain the above object, in a second aspect of the present invention, there is provided a computer-readable storage medium storing a program for causing a computer to implement a method of resetting a substrate processing apparatus having a chamber, the program comprising an evacuating module for evacuating the chamber, a temperature setting module for setting a temperature in the chamber, an abnormality judgment module for judging whether or not there is an abnormality in the chamber, and a seasoning module for stabilizing an atmosphere in the chamber so as to conform to predetermined processing conditions, wherein the abnormality judgment module measures at least one selected from data that change in response to a change in a state inside the chamber, and compares the measured data with reference data that corresponds to the measured data for a normal state in the chamber.

To attain the above object, in a third aspect of the present invention, there is provided a substrate processing apparatus comprising a chamber, an evacuating device that evacuates the chamber, a temperature setting device that sets a temperature in the chamber, an abnormality judgment device that judges whether or not there is an abnormality in the chamber, and a seasoning device that stabilizes an atmosphere in the chamber so as to conform to predetermined processing conditions, wherein the abnormality judgment device measures at least one selected from data that change in response to a change in a state inside the chamber, and compares the measured data with reference data that corresponds to the measured data for a normal state in the chamber.

The above and other objects, features, and advantages of the invention will become more apparent from the following detailed description taken in conjunction with the accompanying drawings.

DETAILED DESCRIPTION OF THE PREFERRED EMBODIMENTS

The present invention will now be described in detail with reference to the drawings showing preferred embodiments thereof.

First, a substrate processing apparatus according to an embodiment of the present invention will be described.

Figure 1:
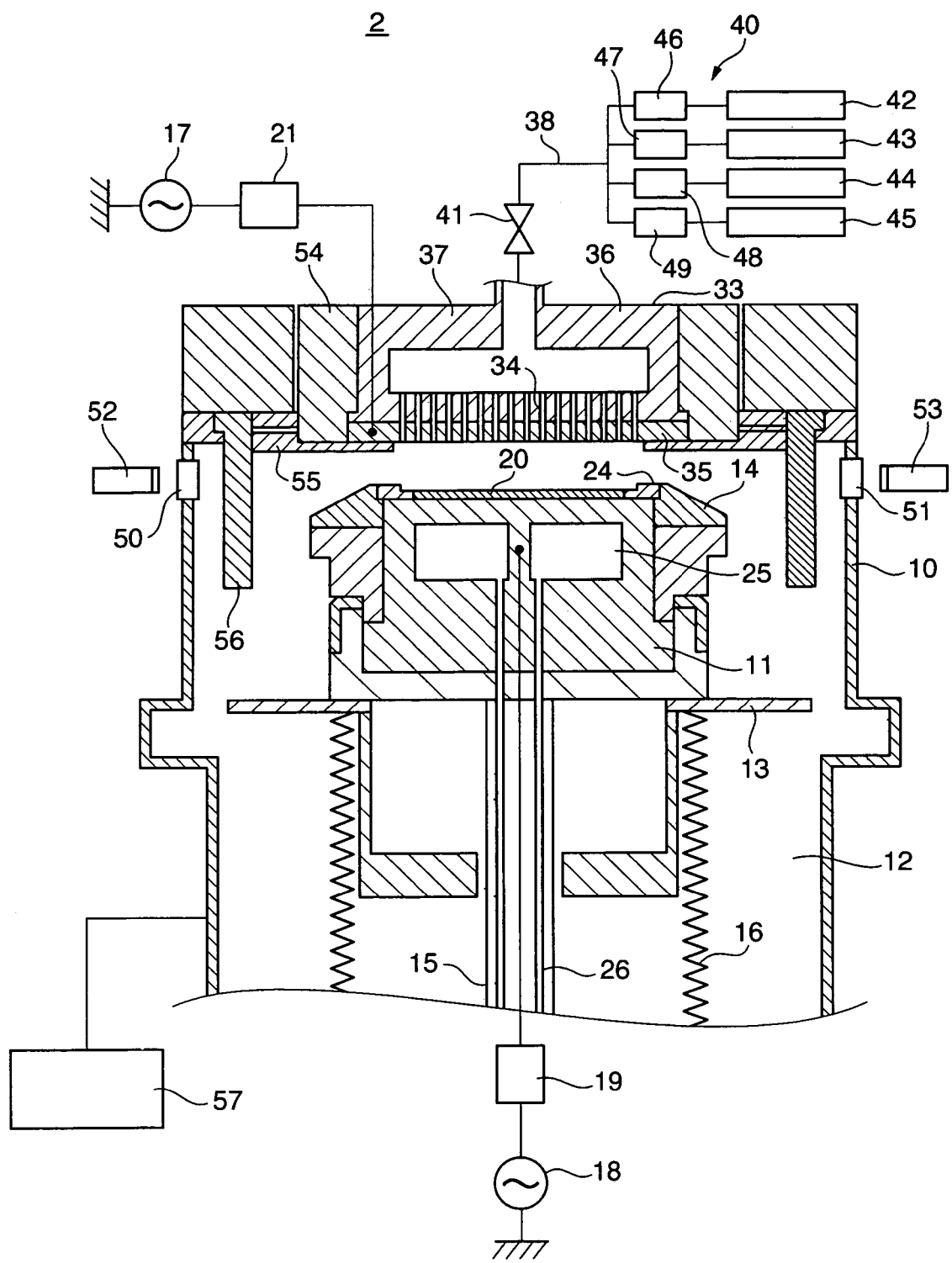
FIG. 1 is a sectional view schematically showing the construction of a processing chamber, which is a substrate processing apparatus according to an embodiment of the present invention.

FIG. 1 is a sectional view schematically showing the construction of a processing chamber, which is the substrate processing apparatus according to the present embodiment.

As shown in FIG. 1, the processing chamber (hereinafter referred to as "P/C") 2, which is constructed as an etching apparatus that subjects semiconductor wafers to etching, has a cylindrical chamber 10 made of a metal such as aluminum or stainless steel. A lower electrode 11 is disposed in the chamber 10 as a stage on which is mounted a semiconductor wafer having a diameter of, for example, 200 mm.

An exhaust path 12 that acts as a flow path through which gas above, the lower electrode 11 is exhausted to the outside of the chamber 10 is formed between a side wall of the chamber 10 and the lower electrode 11. An annular evacuation plate (partitioning plate) 13 is disposed part way along the exhaust path 12, and a space in the exhaust path 12 downstream of the evacuation plate 13 is communicated with an automatic pressure control valve (hereinafter referred to as the "APC valve"), not shown, which is a variable butterfly valve. The APC valve is connected to a turbo-molecular pump (TMP) and a dry pump (DP), which are exhausting pumps for evacuation. The APC valve is used for controlling the pressure in the chamber 10, and also for reducing the pressure in the chamber 10 down to a substantially vacuum state using the TMP and the DP.

A lower high-frequency power source 18 is connected to the lower electrode 11 via a lower matcher 19. The lower high-frequency power source 18 applies predetermined high-frequency electrical power to the lower electrode 11. The lower matcher 19 reduces reflection of the high-frequency electrical power from the lower electrode 11 so as to maximize the efficiency of input of the high-frequency electrical power into the lower electrode 11.

An electrostatic chuck (hereinafter referred to as "ESC") 20 for attracting the semiconductor wafer by electrostatic attraction is disposed in an upper portion of the lower electrode 11. A DC power source (not shown) is electrically connected to the ESC 20. The semiconductor wafer is attracted to and held on an upper surface of the lower electrode 11 through a Johnsen-Rahbek force or a Coulomb force generated by a DC voltage applied to the ESC 20 from the DC power source. Moreover, an annular focus ring 24 made of silicon (Si) or the like is disposed at a periphery of the upper portion of the lower electrode 11. The focus ring 24 focuses a plasma generated above, the lower electrode 11 toward the semiconductor wafer. Moreover, the focus ring 24 is surrounded by an annular cover ring 14 a surface of which is coated with $Y_2O_3$ or the like.

An annular coolant chamber 25 that extends, for example, in a circumferential direction of the lower electrode 11 is provided inside the lower electrode 11. A coolant, for example cooling water, at a predetermined temperature is circulated through the coolant chamber 25 via piping 26 from a chiller unit (not shown). A processing temperature of the semiconductor wafer on the lower electrode 11 and the temperature of the lower electrode 11 are controlled through the temperature of the coolant.

A support 15 provided so as to extend from a lower portion of the lower electrode 11 downward is disposed below the lower electrode 11. The support 15 supports the lower electrode 11. The lower electrode 11 is raised and lowered by rotating a ball screw, not shown. Moreover, the support 15 is surrounded by a bellows cover 16 so as to be cut off from the atmosphere in the chamber 10.

A shower head 33 is disposed in a ceiling portion of the chamber 10. The shower head 33 has a disk-shaped upper electrode plate (CEL(ceiling electrode)) 35 that faces into the chamber 10 and has therein a large number of gas-passing holes 34, and an electrode support 36 that is disposed above, the upper electrode plate 35 and on which the upper electrode plate 35 is detachably supported.

According to the P/C 2, when a semiconductor wafer is transferred into or out from the chamber 10, the lower electrode 11 is lowered down to a semiconductor wafer transferring in/out position; when the semiconductor wafer is being etched, the lower electrode 11 is raised up to a semiconductor wafer processing position, and moreover the ESC 20 attracts and thus holds the semiconductor wafer.

An upper high-frequency power source 17 is connected to the upper electrode plate 35 via an upper matcher 21. The upper high-frequency power source 17 applies predetermined high-frequency electrical power to the upper electrode plate 35. The upper matcher 21 reduces reflection of the high-frequency electrical power from the upper electrode plate 35 so as to maximize the efficiency of input of the high-frequency electrical power into the upper electrode plate 35.

A buffer chamber 37 is provided inside the electrode support 36. A processing gas introducing pipe 38 is connected from a processing gas supply apparatus 40, described below, to the buffer chamber 37. Moreover, a coolant chamber (not shown) that is connected to a chiller unit (not shown) is disposed in a lower portion of the electrode support 36. The electrode support 36 thus functions as a cooling plate for the upper electrode plate 35, whereby the temperature of the upper electrode plate 35 is controlled.

A valve 41 is disposed part way along the processing gas introducing pipe 38, and the processing gas supply apparatus 40 is disposed upstream of the valve 41. The processing gas supply apparatus 40 has a silicon tetrafluoride ($SiF_4$) supply unit 42 that supplies silicon tetrafluoride, a silicon tetrahydride ($SiH_4$) supply unit 43 that supplies silicon tetrahydride, an oxygen gas ($O_2$) supply unit 44 that supplies oxygen gas, an argon gas (Ar) supply unit 45 that supplies argon gas, and MFC's (mass flow controllers) 46 to 49 provided in correspondence with the supply units 42 to 45 respectively. The processing gas supply apparatus 40 mixes together silicon tetrafluoride, silicon tetrahydride, oxygen gas, and argon gas in predetermined flow rate proportions, and supplies the resulting mixture into the chamber 10 as a processing gas. At this time, the MFC's 46 to 49 control the flow rates of the respective components of the processing gas, and thus, in collaboration with the APC valve, control the pressure in the chamber 10 to a desired value. The processing gas supplied by the processing gas supply apparatus 40 may also have carbon tetrafluoride ($CF_4$) mixed therein.

An annular holder 54 that holds the shower head 33 is disposed surrounding the shower head 33. A shield ring 55 that protects a gap between the holder 54 and the shower head 33 from the plasma, described below, is disposed on a lower surface of the holder 54.

Moreover, a cylindrical flow-adjusting exhaust ring 56 that projects out downward is disposed at a periphery of the shield ring 55. The flow-adjusting exhaust ring 56 prevents diffusion of the plasma generated in a space between the lower electrode 11 and the upper electrode plate 35, confining the plasma within this space.

Figure 2:
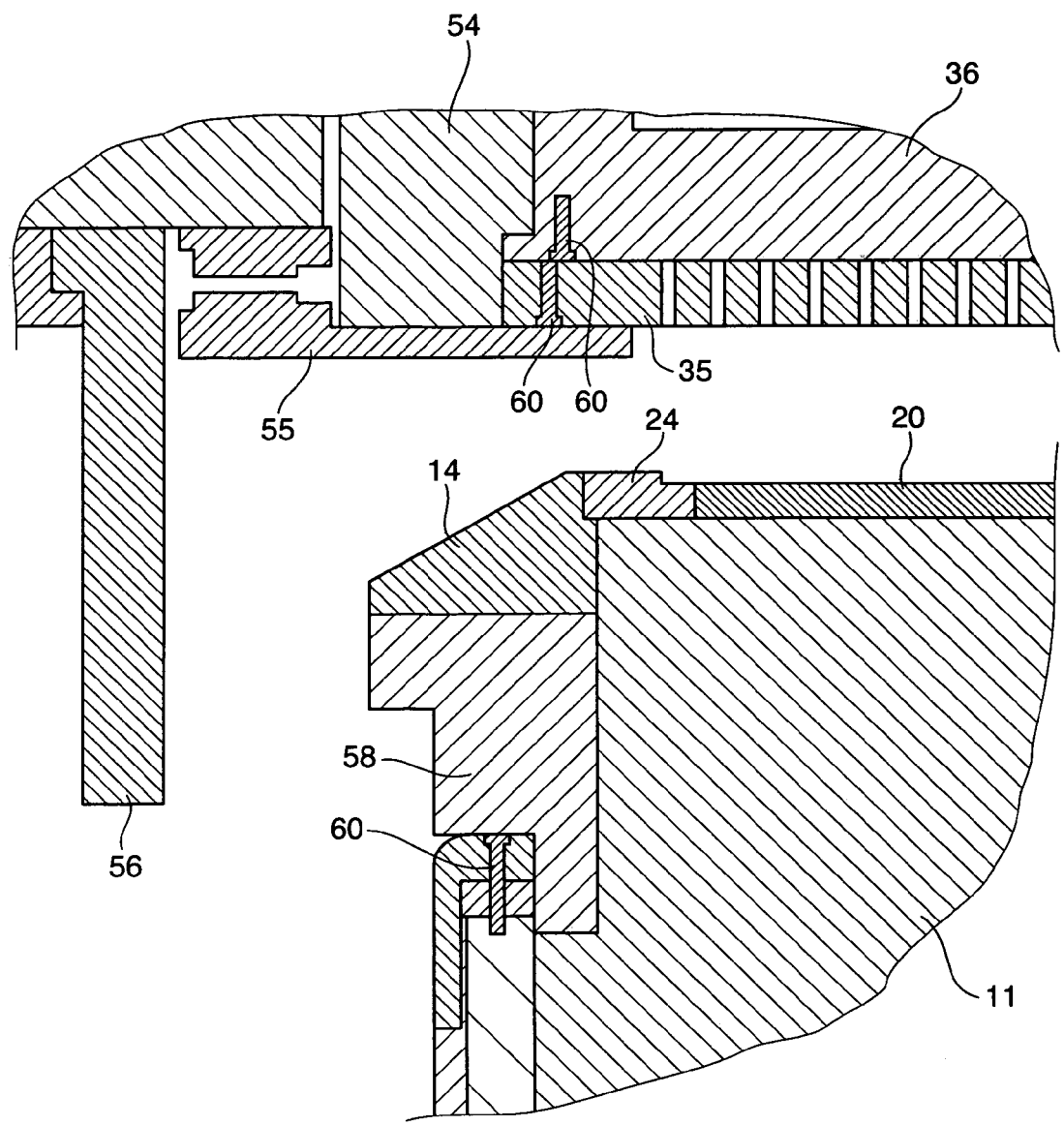
FIG. 2 is a view showing the state of assembly of component parts in the processing chamber.

Component parts in the chamber 10 such as the upper electrode plate 35 and the shield ring 55 described above are assembled in the chamber 10 using screws 60 as shown in FIG. 2. As shown in FIG. 2, the screws 60 are each cut off from the atmosphere in the chamber 10 by a screw cover 58 or a screw cap (not shown).

Two transmission windows 50 and 51 made of quartz glass are disposed in the side wall of the chamber 10 either side of the lower electrode 11 at a height corresponding to the semiconductor wafer processing position. Moreover, a light source 52 that emits laser light is disposed on the opposite side of the transmission window 50 to the chamber 10, and a light-receiving sensor 53 that receives laser light that has been emitted from the light source 52 and passed through the chamber 10 is disposed on the opposite side of the transmission window 51 to the chamber 10. Here, the flow-adjusting exhaust ring 56 described above has slits formed in portions thereof facing respectively the light source 52 and the light-receiving sensor 53, so that the laser light emitted from the light source 52 passes through one slit in the flow-adjusting exhaust ring 56, passes over the semiconductor wafer mounted on the lower electrode 11, passes through the other slit in the flow-adjusting exhaust ring 56, and reaches the light-receiving sensor 53.

Moreover, a heater (not shown) is built into the side wall of the chamber 10. The heater controls the temperature of the side wall when the semiconductor wafer is being subjected to plasma processing.

When the semiconductor wafer is being subjected to the plasma processing, due to the plasma, the atmosphere above, the semiconductor wafer emits light in accordance with the concentration and pressure of the processing gas. The state of plasma generation can thus be monitored by measuring the state of emission of light. According to the P/C 2, laser light passes over the semiconductor wafer as described above, and hence the state of plasma generation can be monitored using the light source 52 and the light-receiving sensor 53.

In the chamber 10 of the P/C 2, high-frequency electrical power is applied to the lower electrode 11 and the upper electrode plate 35 as described above. A high-density plasma is generated from the processing gas in the space between the lower electrode 11 and the upper electrode plate 35 by the applied high-frequency electrical power, whereby ions and radicals are produced. The produced ions and radicals are focused onto the surface of the semiconductor wafer by the focus ring 24, whereby the surface of the semiconductor wafer is physically and chemically etched.

Furthermore, the P/C 2 has a control unit 57 that controls operation of the component parts, and records the state of operation of the component parts as an apparatus log. When, for example, a semiconductor wafer is subjected to the plasma processing, the control unit 57 controls the heater in the side wall of the chamber and the chiller unit so as to control the temperature in the chamber 10 to a desired temperature, and furthermore controls operation of the processing gas supply apparatus 40, the upper high-frequency power source 17 and the lower high-frequency power source 18 so as to generate a desired amount of plasma between the lower electrode 11 and the upper electrode plate 35, this being in accordance with a recipe that indicates the processing procedure.

Moreover, when a semiconductor wafer is subjected to the plasma processing, the control unit 57 records the impedance of the lower matcher 19 and the upper matcher 21, the voltage between the lower electrode 11 and the lower matcher 19 (Vpp), or the opening extent of the APC valve (APC angle) as an apparatus log, and furthermore records the state of emission of light from the atmosphere above, the semiconductor wafer as measured using the light source 52 and the light-receiving sensor 53 (light emission data), the current and voltage of the lower high-frequency power source 18 and so on as measured data.

Next, a method of resetting the substrate processing apparatus according to the present embodiment will be described.

Figure 3:
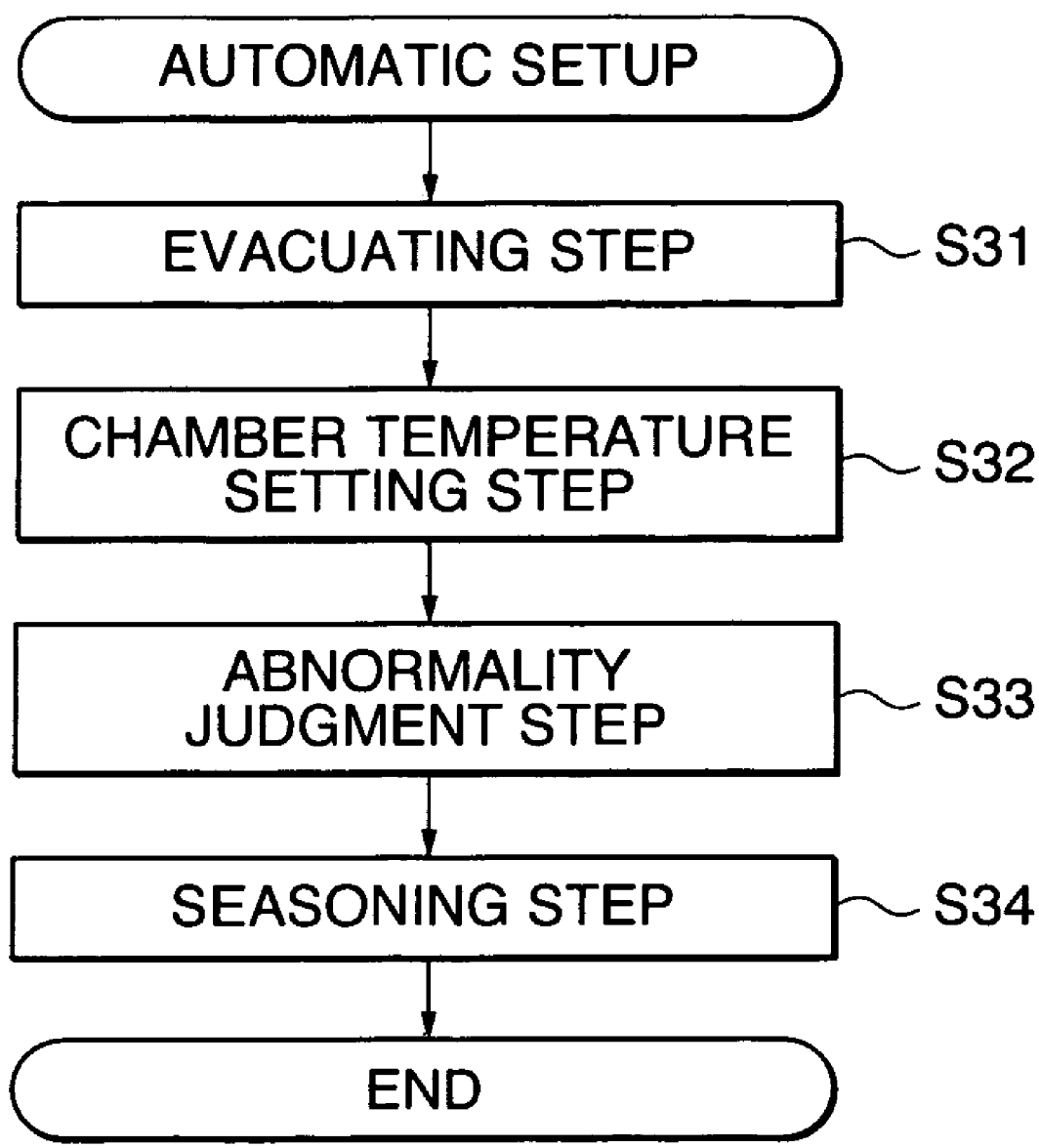
FIG. 3 is a flowchart of an automatic setup process, which is a method of resetting the substrate processing apparatus according to the above embodiment.

FIG. 3 is a flowchart of an automatic setup process, which is the method of resetting the substrate processing apparatus according to the present embodiment. The process is carried out by the control unit 57 in accordance with a program, described below, after maintenance of the P/C 2 as described above. After the automatic setup process, the P/C 2 can carry out predetermined etching on semiconductor wafers for mass production in accordance with a predetermined recipe.

As shown in FIG. 3, first, the APC valve is opened, and the pressure in the chamber 10 is reduced down to a substantially vacuum state using the TMP and the DP (evacuating step) (step S31), then the heater in the side wall of the chamber and the chiller unit control the inside of the chamber 10 to a predetermined temperature (temperature setting step) (step S32), and then an APC server, described below, judges whether or not there is an abnormality in the P/C 2, for example whether or not a component part is missing or out of place, or whether or not there is a leak in the chamber 10, based on measured data or an apparatus log for the component parts (abnormality judgment step) (step S33).

After that, a plurality of dummy wafers are processed, whereby stabilization is carried out such that the chiller unit, the heater, the APC valve, the processing gas supply apparatus 40, the lower high-frequency power source 18, the upper high-frequency power source 17 and so on set the atmosphere in the chamber 10 to conform to predetermined processing conditions as stipulated in a predetermined recipe (seasoning step) (step S34). The APC server then indicates the state with regard to abnormalities of the P/C 2, leakage in the chamber 10 and so on a monitor (not shown) of the P/C 2 or the APC server.

A worker can check the details displayed on the monitor, and decide whether to carry out the predetermined processing on semiconductor wafers for mass production forthwith, or whether to suspend the resetting work and open the lid of the chamber 10 and carry out maintenance once again.

According to the automatic setup process shown in FIG. 3, a worker can detect an abnormality of the P/C 2 using the APC server without opening the lid of the chamber 10, and hence, for example, resetting work that has conventionally taken 3 hours can be carried out in 2 hours, i.e. the resetting work of the P/C 2 can be carried out quickly, and thus the utilization ratio of the P/C 2 can be improved.

The respective steps of the automatic setup process shown in FIG. 3 will now be described in detail.

First, the evacuating step of step S31 will be described.

During the evacuation of the chamber in a conventional resetting process, the temperature in the chamber has been set to be the same as the temperature during the etching of semiconductor wafers for mass production (hereinafter referred to as the "mass production etching", and hence moisture that has got into the chamber and become attached to component parts during maintenance, or alcohol that has become attached to component parts upon wet cleaning has evaporated gradually, and as a result the evacuation has taken much time.

In contrast with this, in step S31 of the automatic setup process according to the present invention, the temperature in the chamber 10 is set to be higher than the temperature during the mass production etching. Specifically, during the evacuation, conventionally the temperatures of the upper electrode, the side wall of the chamber, and the lower electrode have been set to be constant at 60, 50, and 40° C. respectively, whereas in step S31 of the automatic setup process according to the present invention, using the heater in the side wall of the chamber and the chiller unit, the temperatures of the upper electrode, the side wall of the chamber, and the lower electrode are first set to 80, 80, and 40° C. respectively, and then after 1.5 hours has elapsed, are reset to 60, 50, and 40° C. respectively.

According to the evacuation of step S31, the temperature in the chamber 10 is made to be higher than conventionally.

By raising the temperature in the chamber 10, evaporation of moisture or alcohol attached to component parts of the chamber 10 is promoted. The resetting of the P/C 2 can thus be carried out quickly.

Figure 4:
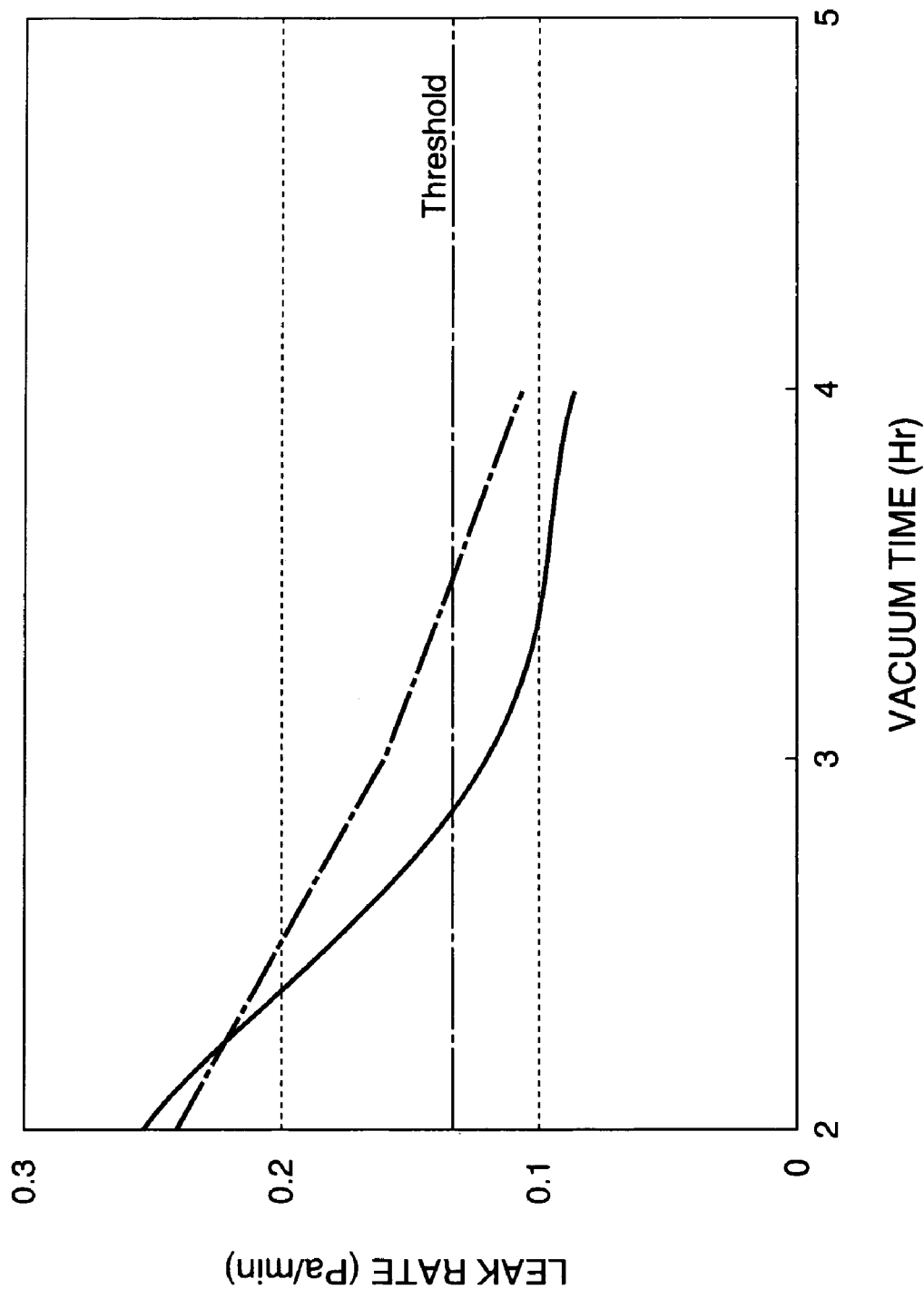
FIG. 4 is a graph showing a comparison of an evacuating time period for the automatic setup process and a conventional resetting process.

FIG. 4 is a graph showing a comparison of the evacuating time period for the automatic setup process shown in FIG. 3 and a conventional resetting process.

In FIG. 4, the leak rate (pressure release rate) from the inside of the chamber for the conventional resetting process is shown by a dashed line, whereas the leak rate from the inside of the chamber 10 for the automatic setup process of the present invention is shown by a full line.

As shown in FIG. 4, to reach 0.13 Pa/min (1 mTorr/min), which is a threshold indicating that the evacuation has been completed, 3.5 hours is required for the conventional resetting process, whereas only approximately 3 hours is required for the automatic setup process of the present invention. According to the automatic setup process of the present invention, the resetting of the P/C 2 can thus be carried out quickly, and hence a decrease in the utilization ratio of the P/C 2 can be prevented.

In step S31 described above, the temperatures of the upper electrode, the side wall of the chamber, and the lower electrode are controlled using the heater in the side wall of the chamber and the chiller unit. However, the temperature in the chamber may instead be raised using only the heater in the side wall of the chamber, or the by applying high-output high-frequency electrical power to the lower electrode 11 or the upper electrode plate 35 (high-power seasoning).

Next, the chamber temperature setting step of step S32 will be described.

In a conventional resetting process, although the accuracy of the etching in the automatic setup process may be lower than the accuracy in the mass production etching, regarding the setting of the temperature in the chamber, the dummy wafer etching has been carried out under the same processing conditions as for the mass production etching, and as a result the dummy wafer etching has been carried out at an etch rate lower than necessary. The dummy wafer etching in the automatic setup process of the conventional resetting process has thus required much time.

In contrast with this, in step S32 of the automatic setup process according to the present invention, to set the etch rate to be fast while securing the minimum required etching accuracy, the dummy wafer etching is carried out under special processing conditions (a special recipe), for example with the temperature in the chamber 10 set to a temperature different to the temperature in the chamber in the conventional resetting process.

Specifically, in step S32, the pressure in the chamber 10 is set to 6.67 Pa (50 mT), the flow rate of oxygen gas supplied by the processing gas supply apparatus 40 is set of 600 sccm, the pressure of helium (He) gas used as a heat-transmitting gas supplied from the ESC 20 toward a rear surface of the dummy wafer is set to $6.67 \times 10^2$ Pa (5 torr) at a central portion of the rear surface and $3.33 \times 10^3$ Pa (25 torr) at a peripheral portion of the rear surface, and the temperatures of the upper electrode, the side wall of the chamber, and the lower electrode are set to 60, 50, and 40° C. respectively.

According to the chamber temperature setting of step S32, based on a special recipe exclusively for the automatic setup process, the atmosphere in the chamber 10 is made to conform to processing conditions enabling the minimum required etching accuracy in the automatic setup process to be secured, and the dummy wafer etching is carried out at a faster etch rate than conventionally. The resetting of the P/C 2 can thus be carried out quickly.

Moreover, generally, in the case of carrying out mass production etching in a plurality of P/C's, a different recipe is used for each P/C in accordance with differences between the P/C's. However, according to the automatic setup process of the present invention, because a special recipe exclusively for the automatic setup process is set, in the case of carrying out the automatic setup process in a plurality of P/C's, the same special recipe is used for each P/C. As a result, light emission data or data relating to the high-frequency power source can be measured under the same conditions for each P/C, and hence the abnormality judgment, described below, can be carried out stably.

Next, the abnormality judgment step of step S33 will be described.

In a conventional resetting process, in the abnormality judgment, the dummy wafer etching is carried out with the same processing gas as in the mass production etching, for example silicon tetrafluoride, introduced into the chamber. However, when silicon tetrafluoride is converted into a plasma, reaction products are readily produced, and hence deposit accumulates on surfaces of component parts of the chamber during the resetting process, which causes the production of particles during the mass production etching.

In contrast with this, in step S33 of the automatic setup process according to the present invention, to prevent production of such a reaction product, a special processing gas exclusively for the automatic setup process is used, for example oxygen gas, which does not produce reaction products upon being converted into a plasma.

According to the abnormality judgment of step S33 described above, when carrying out the dummy wafer etching, oxygen gas, which does not produce reaction products, is introduced into the chamber 10 as the processing gas. Deposit thus does not accumulate in the chamber 10 during the resetting of the P/C 2, and hence transition to mass production etching after the resetting of the P/C 2 can be carried out smoothly.

Moreover, in the abnormality judgment step, the APC (advanced process control) server, which is an external controller connected to the P/C 2, collects measured data or an apparatus log recorded by the control unit 57, and detects component part installation defects, component part cleaning defects, and leak in the chamber 10, as described below, based on the collected apparatus log or measured data. Here, component part installation defects include forgetting to install a component part, a component part being missing or out of place, a component part being installed in the wrong position, and so on.

First, detection of a component part installation defect in the abnormality judgment step will be described.

As described above, if a component part installation defect arises in the chamber, then the state of plasma generation in the chamber becomes unstable. When carrying out the dummy wafer etching, a component part installation defect can thus be detected by monitoring the state of plasma generation in the chamber. In the present embodiment, a component part installation defect is detected based on an apparatus log or measured data that is affected by the state of plasma generation in particular.

In the case of detecting a component part installation defect based on an apparatus log, the apparatus log is recorded by the control unit 57 while the dummy wafer etching is carried out, and hence the APC server or the like can obtain the apparatus log simultaneously with the dummy wafer etching being carried out. The abnormality judgment can thus be carried out quickly.

Apparatus logs that can be used in component part installation defect detection will now be described in detail.

First, the case that the impedance of the lower matcher 19 is used for an apparatus log for component part installation defect detection will be described.

When the state of plasma generation in the chamber changes, the high-frequency electrical power applied from the lower high-frequency power source 18 changes so as to maintain the plasma in a desired state, and accompanying this the impedance of the lower matcher 19 changes. A change in the state of plasma generation in the chamber, and hence a component part installation defect, can thus be detected by monitoring the impedance of the lower matcher 19.

Figure 5:
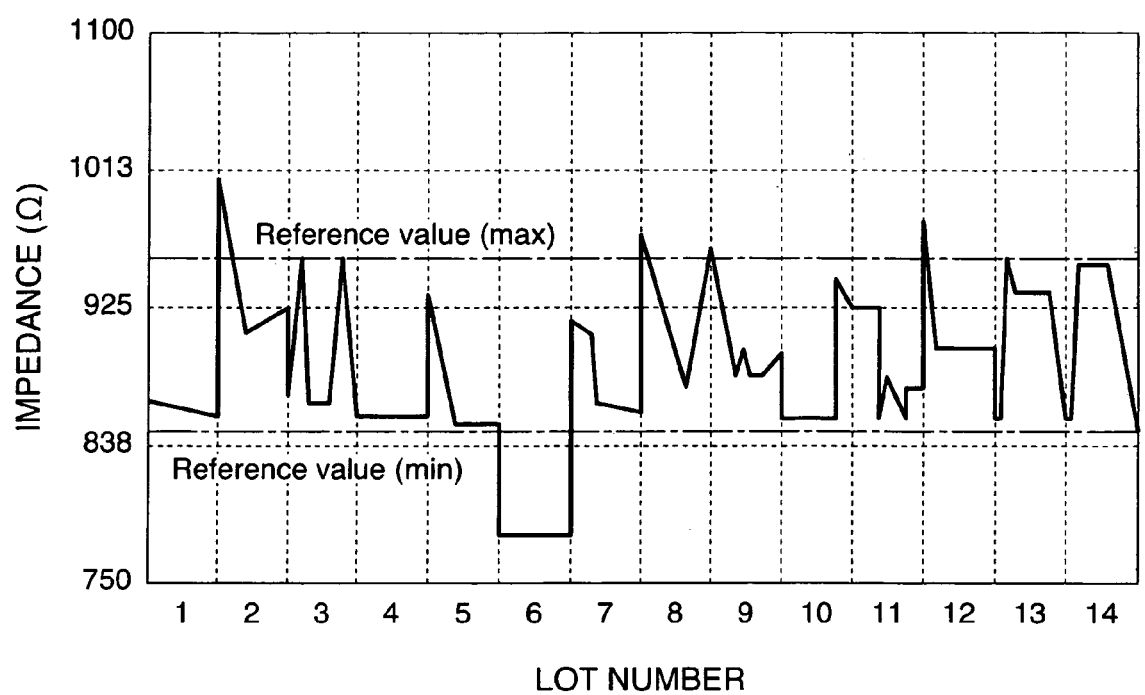
FIG. 5 is a graph showing the relationship between the presence/absence of a component part installation defect and the impedance of a lower matcher.

FIG. 5 is a graph showing the relationship between the presence/absence of a component part installation defect and the impedance of the lower matcher 19.

In FIG. 5, the axis of abscissas shows the lot number for which the automatic setup process was carried out, and the axis of ordinates shows the measured value of the impedance for each lot.

The measured value of the impedance varies over each lot because 25 dummy wafers were etched in each lot and the measured value of the impedance was plotted on the graph for each wafer in each lot. Each measured value of the impedance is the average value during the etching of the dummy wafer in question.

The state of installation of the component parts for each lot was as shown in Table 1 below.

TABLE 1

| Lot No. | Details |
|---|---|
| 1 | Reference |
| 2 | No flow-adjusting exhaust ring |
| 3 | Reference |
| 4 | No screw cover |
| 5 | Reference |
| 6 | No shield ring |
| 7 | Reference |
| 8 | No cover ring |
| 9 | Reference |
| 10 | No screw cap (ESC side) |
| 11 | Reference |
| 12 | No cover ring or focus ring |
| 13 | Reference |
| 14 | No screw cap (cooling plate side) |

For example, in lot 2, the dummy wafer etching was carried out with the flow-adjusting exhaust ring 56 removed. Moreover, for the reference of lot 3 and so on, all of the component parts were installed properly. Thresholds for the component part installation defect judgment were set based on the measured value of the impedance for these reference lots. As shown in FIG. 5, the maximum value of the measured value of the impedance for the reference lots was set as an upper threshold (reference value (max)), and the minimum value of the measured value of the impedance for the reference lots was set as a lower threshold (reference value (min)).

As shown in FIG. 5, the measured value of the impedance for lot 2 clearly exceeded the upper threshold. The flow-adjusting exhaust ring 56 being missing or out of place can thus be detected by monitoring the impedance.

In FIG. 5 described above, the average value during the etching of each dummy wafer is used as the measured value of the impedance. However, the minimum value or the maximum value may be used instead, in which case a component part other than the flow-adjusting exhaust ring 56 being missing or out of place can also be detected.

Moreover, the impedance of the upper matcher 21 also changes in accordance with the state of plasma generation in the chamber, and hence a component part being missing or out of place can also be detected using the measured value of the impedance of the upper matcher 21.

According to the abnormality judgment of step S33 described above, the impedance of the lower matcher 19 is used for an apparatus log for component part installation defect detection. The impedance of the lower matcher 19 changes in accordance with changes in the state of plasma generation in the chamber 10, and hence changes in accordance with whether or not a component part is missing or out of place. Detection of a component part being missing or out of place in the P/C 2 can thus be carried out reliably.

Next, the case that the voltage between the lower electrode 11 and the lower matcher 19 (Vpp) (hereinafter referred to as the "lower voltage") is used for an apparatus log for component part installation defect detection will be described.

When the state of plasma generation in the chamber changes, the high-frequency electrical power applied from the lower high-frequency power source 18 changes so as to maintain the plasma in a desired state, and accompanying this the lower voltage changes. A change it the state of plasma generation in the chamber, and hence a component part installation defect, can thus be detected by monitoring the lower voltage.

Figure 6:
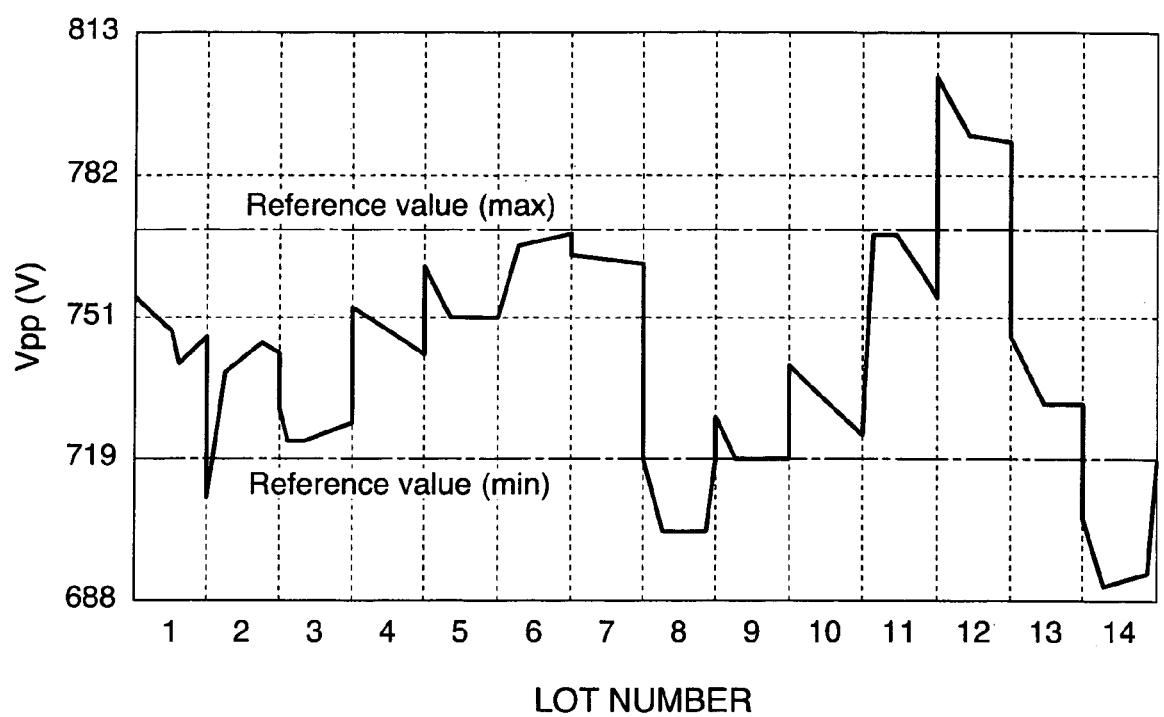
FIG. 6 is a graph showing the relationship between the presence/absence of a component part installation defect and the voltage between a lower electrode and the lower matcher.

FIG. 6 is a graph showing the relationship between the presence/absence of a component part installation defect and the voltage between the lower electrode and the lower matcher (the lower voltage).

In FIG. 6, the axis of abscissas shows the lot number for which the automatic setup process was carried out, and the axis of ordinates shows the measured value of the lower voltage for each lot. Moreover, the state of installation of the component parts for each lot was as shown in Table 1 described above as for FIG. 5.

The lower voltage varies over each lot for the same reason as for FIG. 5. In FIG. 6, as for FIG. 5, each measured value of the lower voltage is the average value during the etching of the dummy wafer in question. Moreover, as shown in FIG. 6, the maximum value of the measured value of the lower voltage for the reference lots was set as an upper threshold (reference value (max)), and the minimum value of the measured value of the lower voltage for the reference lots was set as a lower threshold (reference value (min)).

As shown in FIG. 6, the measured value of the lower voltage for lot 12 clearly exceeded the upper threshold, and furthermore the measured values of the lower voltage for lot 8 and lot 14 clearly dropped below the lower threshold. The cover ring 14 and the focus ring 24 being missing or out of place, the cover ring 14 only being missing or out of place, or the screw cap on the cooling plate side being missing or out of place can thus be detected by monitoring the lower voltage.

In FIG. 6 described above, the average value during the etching of each dummy wafer is used as the measured value of the lower voltage. However, the minimum value or the maximum value may be used instead, in which case a component part other than the above component parts being missing or out of place can also be detected.

Moreover, the voltage between the upper electrode plate 35 and the upper matcher 21 also changes in accordance with the state of plasma generation in the chamber, and hence a component part being missing or out of place can also be detected using the measured value of the voltage between the upper electrode plate 35 and the upper matcher 21.

According to the abnormality judgment of step S33 described above, the lower voltage is used for an apparatus log for component part installation defect detection. The lower voltage changes in accordance with changes in the state of plasma generation in the chamber 10, and hence changes in accordance with whether or not a component part is missing or out of place. Detection of a component part being missing or out of place in the P/C 2 can thus be carried out reliably.

Next, the case that the opening extent of the APC valve (the APC angle) is used for an apparatus log for component part installation defect detection will be described.

When the state of plasma generation in the chamber changes, the pressure in the chamber 10 must be changed to maintain the plasma in a desired state, and accompanying this the opening extent of the APC valve changes. A change in the state of plasma generation in the chamber, and hence a component part installation defect, can thus be detected by monitoring the opening extent of the APC valve.

Figure 7:
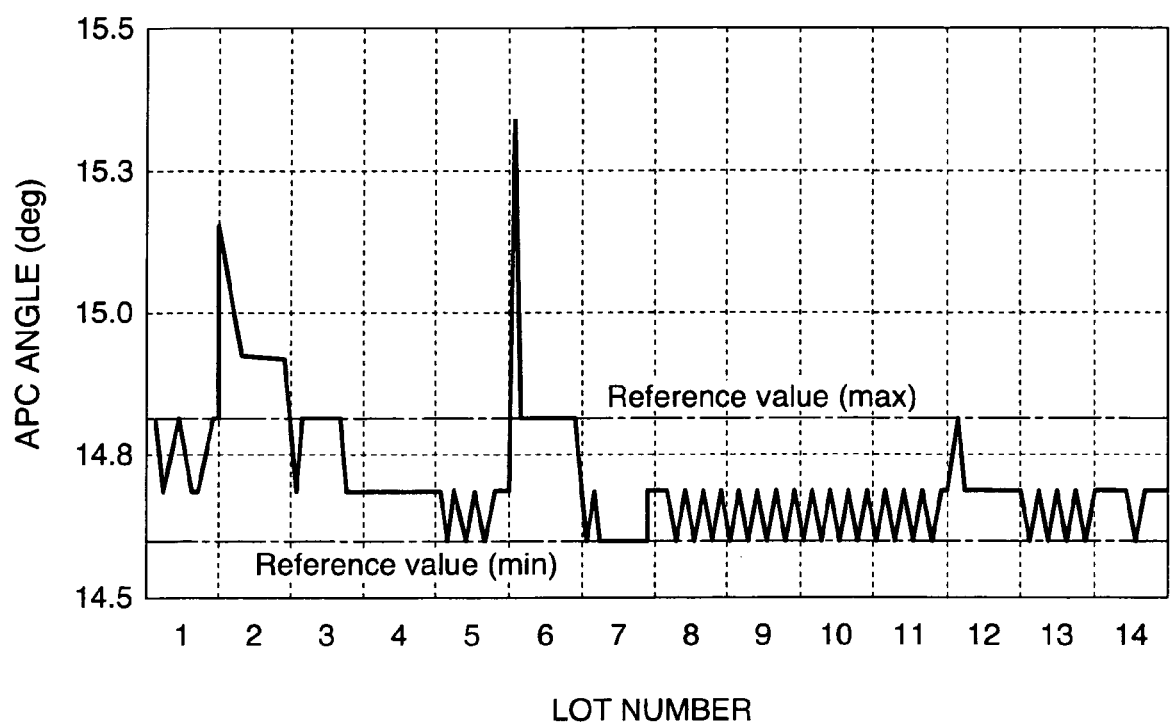
FIG. 7 is a graph showing the relationship between the presence/absence of a component part installation defect and the opening extent of an APC valve.

FIG. 7 is a graph showing the relationship between the presence/absence of a component part installation defect and the opening extent of the APC valve.

In FIG. 7, the axis of abscissas shows the lot number for which the automatic setup process was carried out, and the axis of ordinates shows the measured value of the opening extent of the APC valve for each lot. Moreover, the state of installation of the component parts for each lot was as shown in Table 1 described above as for FIG. 5.

The opening extent of the APC valve varies over each lot for the same reason as for FIG. 5. In FIG. 7, as for FIG. 5, each measured value of the opening extent of the APC valve is the average value during the etching of the dummy wafer in question. Moreover, as shown in FIG. 7, the maximum value of the measured value of the opening extent of the APC valve for the reference lots was set as an upper threshold (reference value (max)), and the minimum value of the measured value of the opening extent of the APC valve for the reference lots was set as a lower threshold (reference value (min)).

As shown in FIG. 7, the measured value of the opening extent of the APC valve for lot 2 clearly exceeded the upper threshold. The flow-adjusting exhaust ring 56 being missing or out of place can thus be detected by monitoring the opening extent of the APC valve.

In FIG. 7 described above, the average value during the etching of each dummy wafer is used as the measured value of the opening extent of the APC valve. However, the minimum value or the maximum value may be used instead, in which case a component part other than the above component parts being missing or out of place can also be detected.

According to the abnormality judgment of step S33 described above, the opening extent of the APC valve is used for an apparatus log for component part installation defect detection. The opening extent of the APC valve changes in accordance with changes in the state of plasma generation in the chamber 10, and hence changes in accordance with whether or not a component part is missing or out of place. Detection of a component part being missing or out of place in the P/C 2 can thus be carried out reliably.

In the abnormality judgment of step S33 described above, the cases that the impedance of the lower matcher 19, the voltage between the lower electrode 11 and the lower matcher 19, and the opening extent of the APC valve are used for apparatus logs for component part installation defect detection have been described. However, apparatus logs that can be used in the abnormality judgment are not limited thereto, but rather any apparatus log that changes in accordance with changes in the state of plasma generation in the chamber can be used. The state of plasma generation in the chamber also changes in accordance with the type of the P/C, and hence it is preferable to investigate the relationship between the state of plasma generation in the chamber and component parts being missing or out of place for each type of P/C in advance, and select the apparatus log to be used for component part installation defect detection based on the results of the investigation.

On the other hand, in the case of detecting a component part installation defect based on measured data such as data on light emission above, the semiconductor wafer or data relating to a high-frequency power source, the measured data can easily be measured by the control unit 57 or the like during dummy wafer etching, and hence the APC server or the like can obtain the measured data easily. The abnormality judgment can thus be carried out easily.

Measured data that can be used in component part installation defect detection will now be described in detail.

First, the case that data on light emission above, the semiconductor wafer is used as measured data for component part installation defect detection will be described.

If a component part installation defect arises in the chamber, then the state of plasma generation in the chamber changes. For example, if the focus ring 24 is missing or out of place, then the plasma is not focused over the semiconductor wafer; if the flow-adjusting exhaust ring 56 is missing or out of place, then the plasma diffuses out from the space between the lower electrode 11 and the upper electrode plate 35. When the state of plasma generation in the chamber changes, the dummy wafer light emission data also changes. A change in the state of plasma generation in the chamber, and hence a component part installation defect, can thus be detected by monitoring the light emission data.

Figure 8:
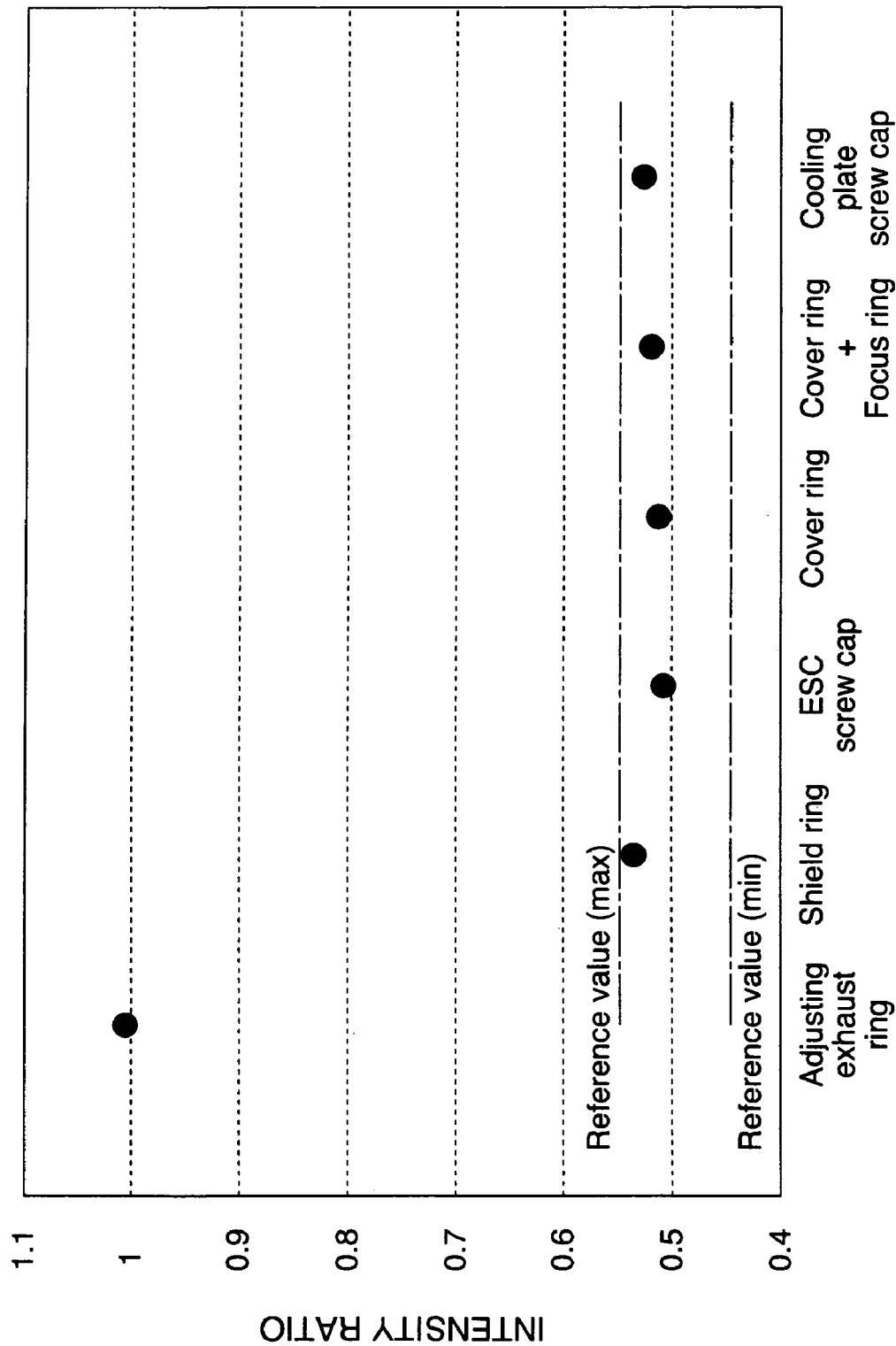
FIG. 8 is a graph showing the relationship between the presence/absence of a component part installation defect and light emission data.

FIG. 8 is a graph showing the relationship between the presence/absence of a component part installation defect and light emission data.

In FIG. 8, the axis of abscissas shows the component part that is missing, and the axis of ordinates shows the ratio between the light emission data when the component part is missing (hereinafter referred to as the "test data") and the light emission data for a state in which all of the component parts have been installed properly (a reference state) (hereinafter referred to as the "reference data").

First, the ratio between the test data and the reference data (hereinafter referred to as the "light intensity ratio") will be described.

First, the reference data is measured over a predetermined wavelength region, for example 200 to 800 nm, and the test data is also measured over the predetermined wavelength region, for example 200 to 800 nm. Next, the ratio $A_i$ of the test data to the reference data at each wavelength i is calculated as shown in equation (1) below.

$$A_i = a_i \text{ (test data)}/a_i \text{ (reference data)},$$

$$i = 200 \text{ to } 800 \text{ nm} \tag{1}$$

The average value $A_{ave}$ of the calculated $A_i$'s is then calculated.

Next, as shown in equation (2) below, the absolute value of the difference between $A_i$ and $A_{ave}$ at each wavelength i is calculated, and the sum B of the calculated absolute values of the differences is calculated. The calculated sum B is taken as the light intensity ratio in FIG. 8.

$$B = \sum_{i=200}^{800} |A_i - A_{ave}| \quad (2)$$

Next, setting of thresholds shown in FIG. 8 will be described.

First, n dummy wafers or the like are prepared, and the reference data is measured for each dummy wafer in the reference state. Then, one measured test data is selected as the reference data in equation (1) above and another measured reference data as the reference data in equation (1) from the measured reference data for the n dummy wafers. Next, the ratio $A_i$ is calculated at each wavelength i in accordance with equation (1) above, and then the light intensity ratio $B_k$ is calculated in accordance with equation (2) above. This sequence of calculations described above is repeated n times, whereby n light intensity ratios B are calculated. Next, the average value ($B_{ave}$) of the n light intensity ratios B and the standard deviation ($B_{sigma}$) ($\sigma$) are calculated. $B_{ave}+6\sigma$ is then set as an upper threshold (reference value (max)), and $B_{ave}-6\sigma$ is set as a lower threshold (reference value (min)).

As shown in FIG. 8, in the case that the flow-adjusting exhaust ring was missing, the light intensity ratio clearly exceeded the upper threshold. The flow-adjusting exhaust ring 56 being missing or out of place can thus be detected by monitoring the light emission data.

According to the abnormality judgment of step S33 described above, data on light emission above, the semiconductor wafer is used as measured data for component part installation defect detection. The data on light emission above, the semiconductor wafer can easily be measured, and moreover changes in accordance with changes in the state of plasma generation in the chamber 10, and hence changes in accordance with whether or not a component part is missing or out of place. Detection of a component part being missing or out of place in the P/C 2 can thus be carried out reliably without causing a decrease in the utilization ratio of the P/C 2.

Moreover, according to the abnormality judgment of step S33 described above, the light intensity ratio is calculated from the light emission data. The light intensity ratio is dimensionless, and hence there is no effect from the magnitude of the test data and the reference data used in calculation of the light intensity ratio. Detection of a component part being missing or out of place in the P/C 2 can thus be carried out accurately.

Next, the case that data relating to a high-frequency power source (hereinafter referred to as "high frequency data") is used as measured data for component part installation defect detection will be described.

If a component part installation defect arises in the chamber, then the state of plasma generation in the chamber changes. Upon the state of plasma generation in the chamber changing, the high-frequency electrical power applied from the lower high-frequency power source 18 changes so as to maintain the plasma in a desired state. A change in the state of plasma generation in the chamber, and hence a component part installation defect, can thus be detected by monitoring high frequency data, for example the voltage, the current, the phase, or the impedance.

Figure 9:
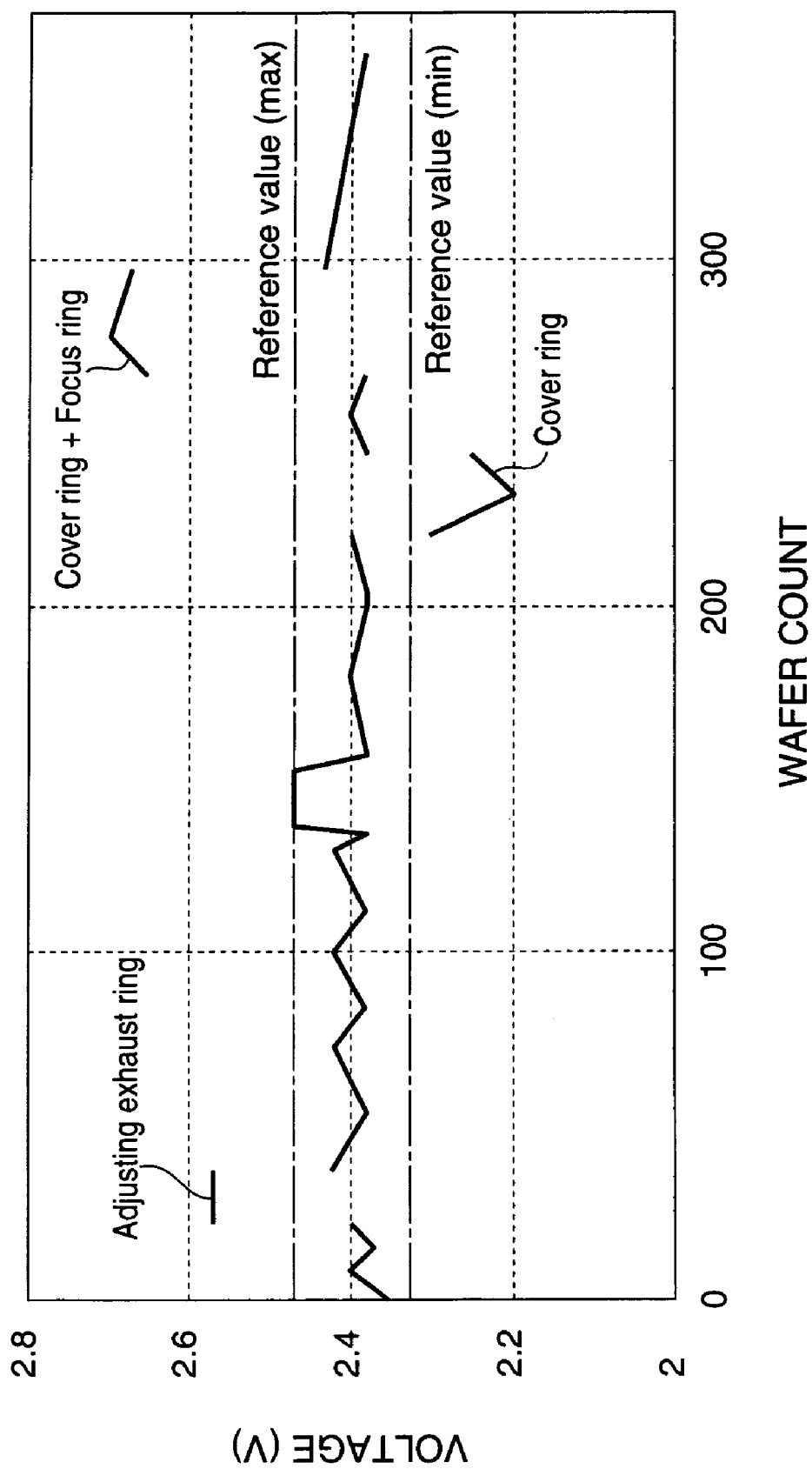
FIG. 9 is a graph showing the relationship between the presence/absence of a component part installation defect and high frequency data.

FIG. 9 is a graph showing the relationship between the presence/absence of a component part installation defect and high frequency data.

In FIG. 9, the axis of abscissas shows the number of the dummy wafer etched (the water count), and the axis of ordinates shows the measured value of the voltage applied in the chamber 10. Moreover, the component part names shown in FIG. 9 indicate the component part removed from the chamber 10 for the wafer count in question.

The measured value of the voltage varies with the wafer count because the measured value of the voltage was plotted on the graph for each dummy wafer. Each measured value of the voltage is the average value during the etching of the dummy wafer in question. Moreover, the average value of the measured value of the voltage and the standard deviation ($\sigma$) were calculated. Average value+$6\sigma$ was set as an upper threshold (reference value (max)), and average value−$6\sigma$ was set as a lower threshold (reference value (min)).

As shown in FIG. 9, in the case that the flow-adjusting exhaust ring was missing, and the case that the cover ring and the focus ring were missing, the measured value of the voltage clearly exceeded the upper threshold, and furthermore in the case that the cover ring only was missing, the measured value of the voltage clearly dropped below the lower threshold. The flow-adjusting exhaust ring 56 being missing or out of place, the cover ring 14 and the focus ring 24 being missing or out of place, or the cover ring 14 only being missing or out of place can thus be detected by monitoring the voltage applied in the chamber 10.

In FIG. 9 described above, the average value during the etching of each dummy wafer is used as the measured value of the voltage applied in the chamber 10. However, the minimum value or the maximum value may be used instead, in which case a component part other than the above component parts being missing or out of place can also be detected.

Figure 10:
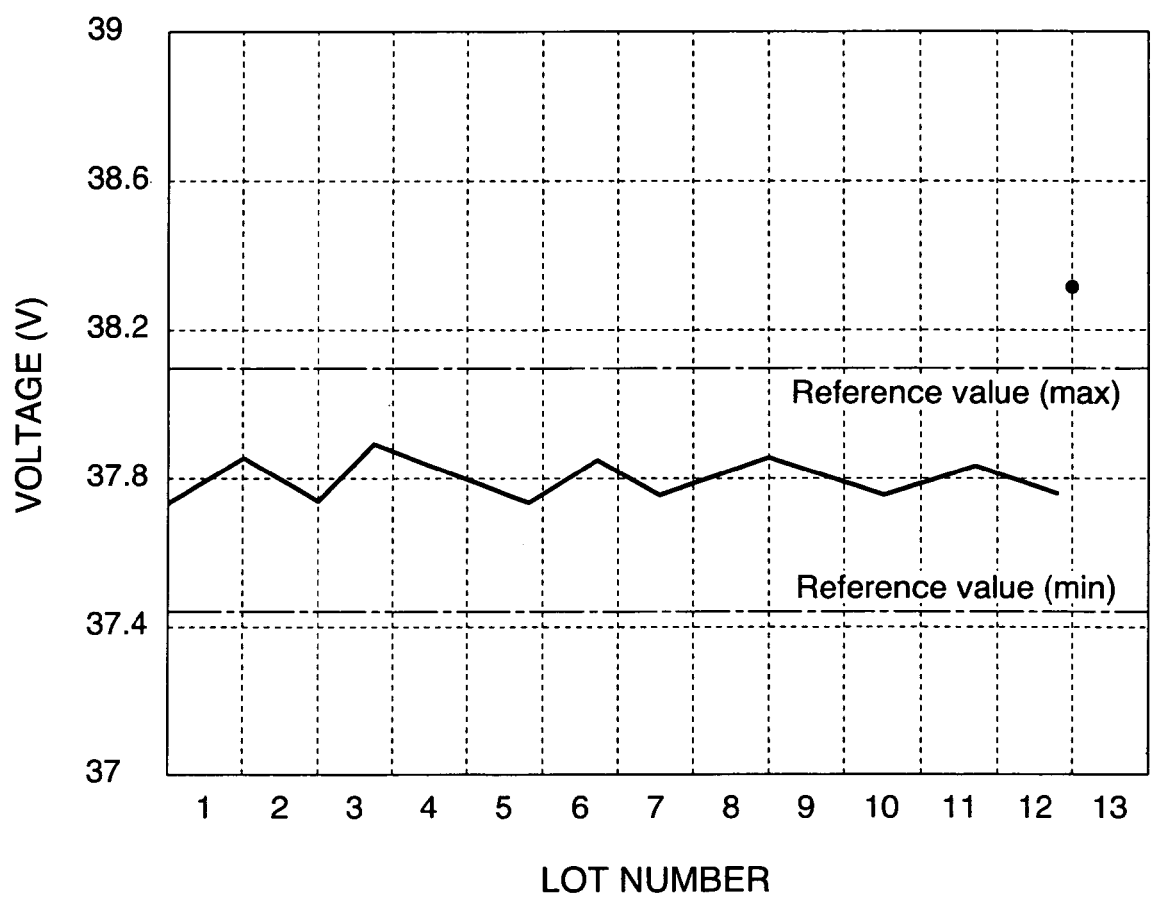
FIG. 10 is another graph showing the relationship between the presence/absence of a component part installation defect and high frequency data.

FIG. 10 is another graph showing the relationship between the presence/absence of a component part installation defect and high frequency data.

In FIG. 10, the axis of abscissas shows the lot number for which the automatic setup process was carried out, and the axis of ordinates shows the measured value of the voltage applied in the chamber 10.

The measured value of the voltage varies over each lot because 25 dummy wafers were etched in each lot and the measured value of the voltage was plotted on the graph for each wafer in each lot. Each measured value of the voltage is the average value during the etching of the dummy wafer in question.

The state of installation of the component parts for each lot was as shown in Table 2 below.

TABLE 2

| Lot No. | Details |
| --- | --- |
| 1 | Reference |
| 2 | Reference |
| 3 | Reference |
| 4 | Reference |
| 5 | Reference |
| 6 | Reference |
| 7 | Reference |
| 8 | Reference |
| 9 | Reference |
| 10 | Reference |
| 11 | Upper electrode plate screw loose |

TABLE 2-continued

| Lot No. | Details |
|---|---|
| 12 | Shield ring askew |
| 13 | No rubber on rear surface of focus ring |

For example, in lot 11, the dummy wafer etching was carried out with the tightening torque of a screw for installing the upper electrode plate 35 reduced. Moreover, for the reference of lot 1 and so on, all of the component parts were installed properly. Thresholds for the component part installation defect judgment were set based on the measured value of the voltage for these reference lots. As shown in FIG. 10, the average value of the measured value of the voltage and the standard deviation (σ) were calculated for the reference lots, and average value+6σ was set as an upper threshold (reference value (max)), and average value−6σ was set as a lower threshold (reference value (min)).

As shown in FIG. 10, the measured value of the voltage in the case that there was no heat-insulating rubber on the rear surface of the focus ring clearly exceeded the upper threshold. The rubber on the rear surface of the focus ring being missing, i.e. a component part installation defect, can thus be detected by monitoring the voltage applied in the chamber 10.

According to the abnormality judgment of step S33 described above, high frequency data is used as measured data for component part installation defect detection. The high frequency data can easily be measured, and moreover changes in accordance with changes in the state of plasma generation in the chamber 10, and hence changes in accordance with whether or not there is a component part installation defect. Detection of a component part installation defect in the P/C 2 can thus be carried out reliably without causing a decrease in the utilization ratio of the P/C 2.

In FIGS. 9 and 10 described above, the voltage applied in the chamber 10 is used as the high frequency data. However, apart from the voltage, the current, the phase, or the impedance may be used.

Detection of a component part cleaning defect in the abnormality judgment step will now be described.

If a component part cleaning defect arises in the chamber, then the state of plasma generation in the chamber becomes unstable due to deposit remaining accumulated after cleaning. When carrying out the dummy wafer etching, a component part cleaning defect can thus be detected by monitoring the state of plasma generation in the chamber. Here, a "component part cleaning defect" means a state in which deposit on the surface of a component part has not been removed through wet cleaning or the like but rather remains accumulated thereon.

The case that data on light emission above, the semiconductor wafer is used as measured data for component part cleaning defect detection will now be described.

If a component part cleaning defect arises in the chamber, then the state of plasma generation in the chamber changes. Upon the state of plasma generation in the chamber changing, the dummy wafer light emission data also changes. A component part cleaning defect can thus be detected by monitoring the light emission data.

Figure 11:
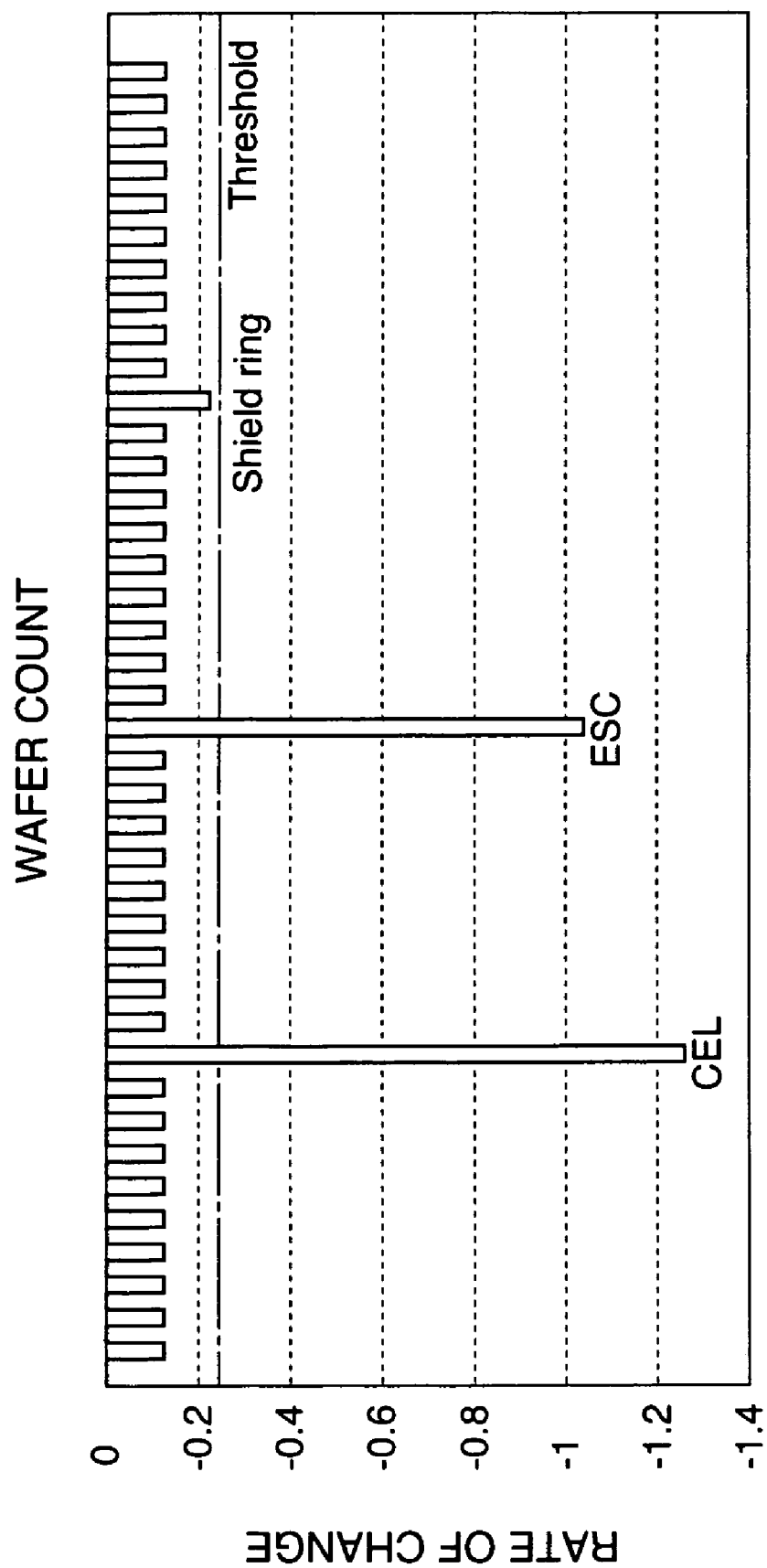
FIG. 11 is a graph showing the relationship between the presence/absence of a component part cleaning defect and light emission data.

FIG. 11 is a graph showing the relationship between the presence/absence of a component part cleaning defect and light emission data.

In FIG. 11, the axis of abscissas shows the number of the dummy wafer etched (the wafer count), and the axis of ordinates shows the rate of change of the light intensity ratio for the dummy wafer. Moreover, the component part names shown in FIG. 11 indicate the component part having deposit attached to the surface thereof in the dummy wafer etching corresponding to the wafer count in question.

Here, the rate of change of the light intensity ratio means the rate of change, from the atmosphere above, the dummy wafer starting to emit light up until 10 seconds has elapsed, of the ratio, out of the light emission data measured over a predetermined wavelength region for the same dummy wafer, between the light emission data at a wavelength at which the light intensity changes sensitively in response to a component part cleaning defect (e.g. 656.5 nm), and the light emission data at a wavelength at which the light intensity does not change regardless of whether or not a component part cleaning defect has arisen (e.g. 374 nm). The reason that a wavelength at which the light intensity changes sensitively in accordance with a component part cleaning defect is 656.5 nm is that CF reaction products emit light strongly at a wavelength of 656.5 nm.

Regarding a threshold shown in FIG. 11, the average value of the rate of change of the light intensity ratio in the case that component parts having deposit attached to the surface thereof were not disposed in the chamber 10 was calculated, and the standard deviation (σ) of the rate of change of the light intensity ratio in this case was further calculated, and then the threshold was set to "average value−6σ".

As shown in FIG. 11, the rate of change of the light intensity ratio in the case that deposit was attached to the surface of the upper electrode (CEL) plate, or the case that deposit was attached to the surface of the ESC was clearly below the threshold. An upper electrode cleaning defect or an ESC cleaning defect can thus be detected by monitoring the light emission data.

According to the abnormality judgment of step S33 described above, data on light emission above, the semiconductor wafer is used as measured data for component part cleaning defect detection. The data on light emission above, the semiconductor wafer can easily be measured, and moreover changes in accordance with changes in the state of plasma generation in the chamber 10, and hence changes in accordance with whether or not a component part cleaning defect has arisen. Detection of a component part cleaning defect in the P/C 2 can thus be carried out reliably without causing a decrease in the utilization ratio of the P/C 2.

Moreover, according to the abnormality judgment of step S33 described above, the rate of change of the light intensity ratio is calculated over 10 seconds from immediately after the light emission starts based on the light emission data. CF reaction products rapidly react with oxygen gas and so on in the chamber 10 and are thus converted into other products, whereby the amount of light at a wavelength of 656.5 nm rapidly decays. By calculating the rate of change of the light intensity ratio, the presence of CF reaction products can thus be detected reliably, and hence component part cleaning defect detection can be carried out more reliably.

Next, detection of a leak in the chamber 10 in the abnormality judgment step will be described.

If a leak in the chamber 10 arises and hence air from the outside flows into the chamber 10, then in etched dummy wafer light emission data, the light emission amount for light due to constituent gases of air increases. A leakage check can thus be carried out by monitoring the light emission data. Specifically, the leakage check can be carried out by monitoring the light emission data at a wavelength at which the light emission amount changes sensitively upon the influx of, for example, nitrogen gas ($N_2$) out of the constituent gases of air.

If nitrogen gas flows into the chamber 10, then the light emission amount for the light emission data at a wavelength of 745 nm increases greatly, whereas the light emission amount for the light emission data at a wavelength of 560 nm hardly changes. In the abnormality judgment of step S33, the ratio of the light emission amount for the light emission data at a wavelength of 745 nm to the light emission amount for the light emission data at a wavelength of 560 nm (hereinafter referred to as the "light emission ratio") is thus calculated, and a leakage check is carried out by comparing the calculated light emission ratio with a threshold, described below.

Figure 12:
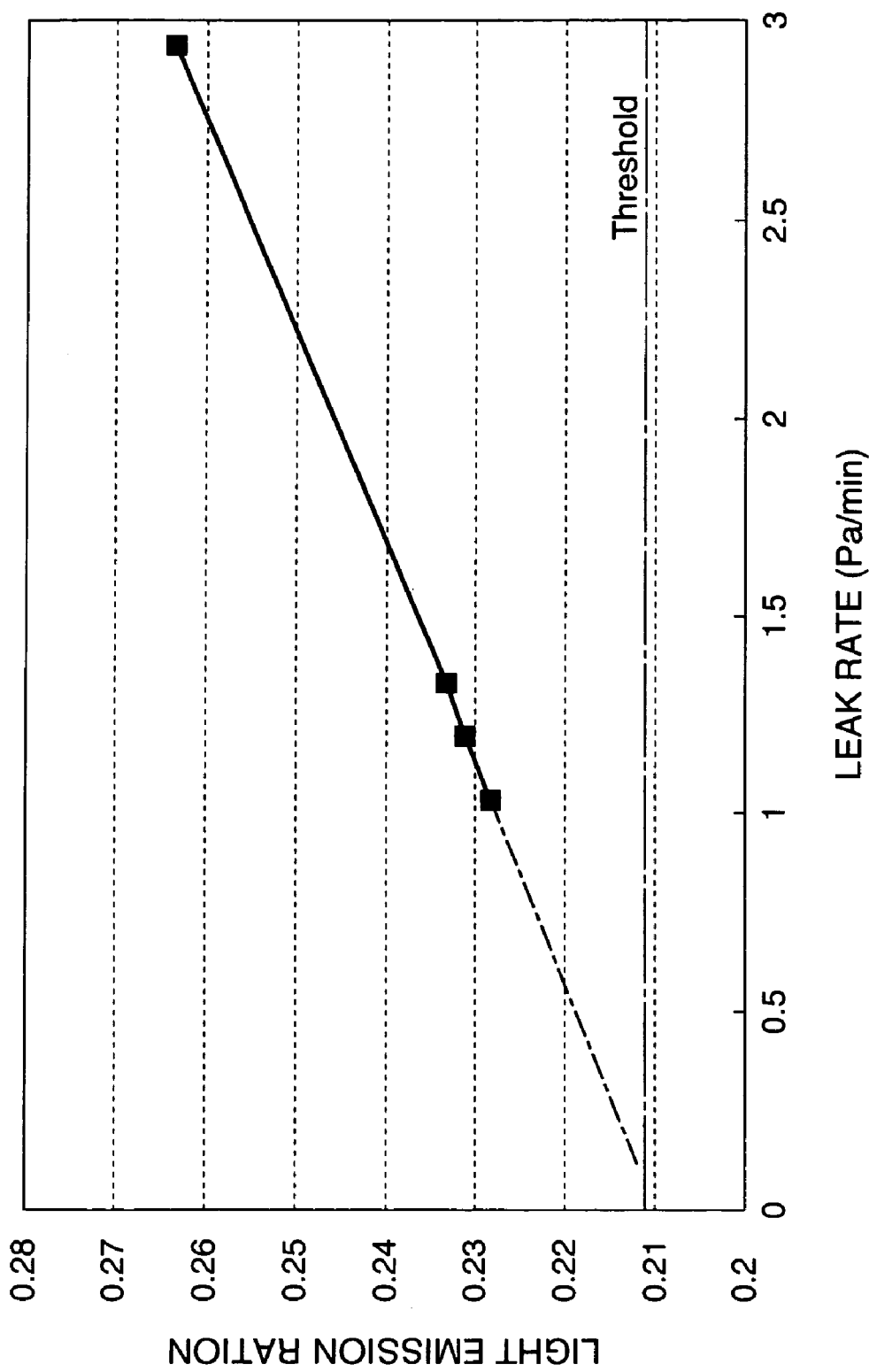
FIG. 12 is a graph showing the relationship between a chamber leak rate and a light emission ratio.

FIG. 12 is a graph showing the relationship between the chamber leak rate and the light emission ratio.

In FIG. 12, the axis of abscissas shows the leak rate as the amount of leak in the chamber 10, and the axis of ordinates shows the light emission ratio. Moreover, regarding the threshold, the average value of the light emission ratio for the chamber 10 in a normal state was calculated, and the standard deviation ($\sigma$) of the light emission ratio in this state was further calculated, and then average value+$6\sigma$ was used as the threshold. Each point in FIG. 12 represents the measured value of the light emission ratio for a leak rate in question, and the alternate long and short dash line shows the relationship between the leak rate and the light emission ratio predicted based on the measured values of the light emission ratio.

As shown in FIG. 12, the leak rate when the alternate long and short dash line reaches the threshold is a leak rate when it is judged as "NO GOOD" using the measured value of the light emission ratio, and 0.05 Pa/min (0.4 mT/min). It can thus be detected whether or not there is a leak of rate less than the general permissible value of 0.13 Pa/min (1.0 mT/min).

According to the abnormality judgment of step S33 described above, it is detected whether or not there is a leak in the chamber 10 based on the light emission ratio for the etched dummy wafer light emission data, specifically the ratio of the light emission amount for the light emission data at a wavelength of 745 nm to the light emission amount for the light emission data at a wavelength of 560 nm. If a leak in the chamber 10 arises, then nitrogen gas from the outside flows in, and hence the light emission amount for light due to the nitrogen gas increases. Moreover, the light emission ratio is dimensionless, and hence there is no effect from the magnitude of the light emission amount at each of the two wavelengths used in calculation of the ratio of light emission amount. The leakage check can thus be carried out more accurately.

As described above, according to the process shown in FIG. 3, in the abnormality judgment, at least one selected from data such as measured data and apparatus logs that change in response to a change in the state inside the chamber 10 is measured, and the measured data is compared with reference data that corresponds to the measured data for a normal state. That is, the abnormality judgment is carried out based on at least one selected from data that change in response to a change in the state inside the chamber 10, without using results of multivariate analysis on the measured data and reference data in the abnormality judgment. The judgment of abnormalities in the P/C 2 can thus be carried out accurately. Moreover, there is no need to reset a normal model every time maintenance is carried out, and hence the utilization ratio of the P/C 2 is not caused to decrease.

Next, the seasoning step of step S34 will be described.

In seasoning in a conventional resetting process, judgment of whether or not the atmosphere in the chamber conforms to predetermined processing conditions stipulated in a predetermined recipe, i.e. whether or not seasoning has been completed, has been carried out through whether or not a predetermined number of dummy wafers, for example 50 dummy wafers, have been etched. There has thus been needless etching, resulting in the seasoning taking much time.

In contrast with this, in step S34 of the automatic setup process according to the present invention, light emission data is monitored. Once the atmosphere in the chamber 10 has become stable so as to conform to predetermined processing conditions stipulated in a predetermined recipe, the state of plasma generation in the chamber becomes stable, and hence the state of emission of light from the atmosphere above, the dummy wafer also becomes stable. It can thus be judged whether the seasoning has been completed by monitoring the light emission data. Specifically, if the difference in the light emission data between two consecutively etched dummy wafers has become low, then it can be judged that the atmosphere in the chamber 10 has become stable and hence the seasoning has been completed.

Figure 13:
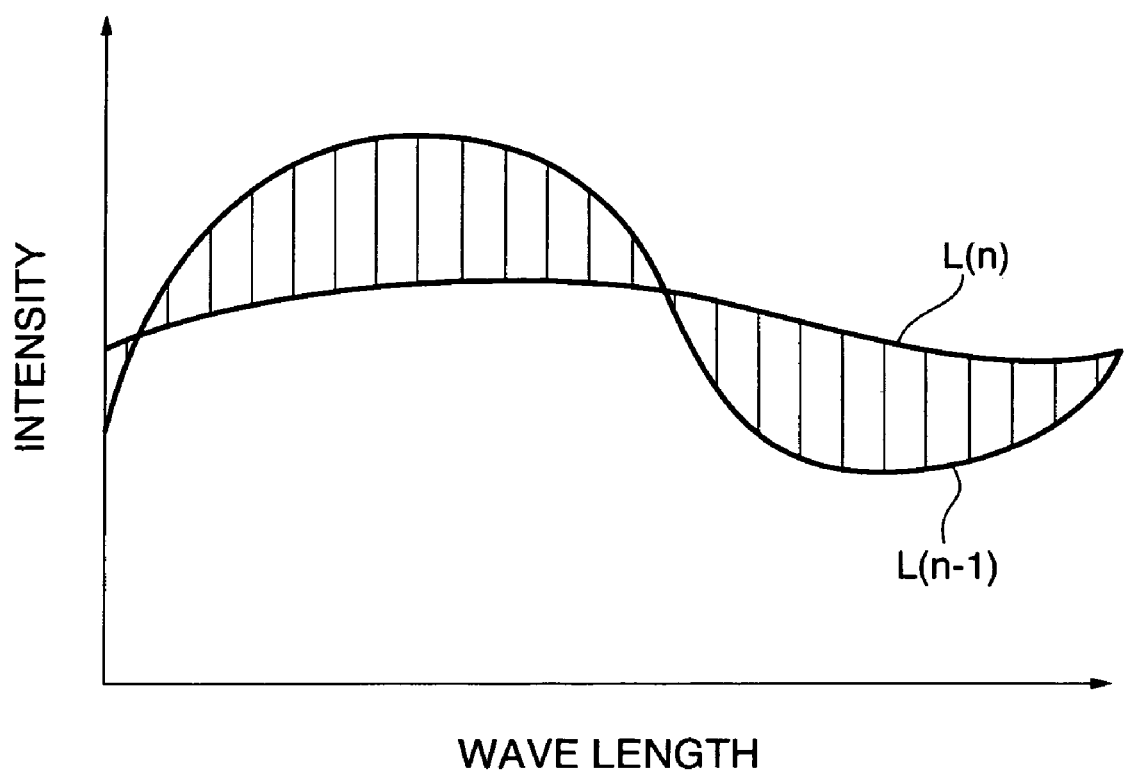
FIG. 13 is a graph showing PDC data, which is light emission data used in seasoning.

FIG. 13 is a graph showing PDC (posterior data calibration) data, which is light emission data used in the seasoning.

As shown in FIG. 13, the PDC data is calculated by first measuring, over a predetermined wavelength region, light emission data $L(n)$ for the $n^{th}$ dummy wafer and light emission data $L(n-1)$ for the $(n-1)^{th}$ dummy wafer, respectively, these dummy wafers being consecutively etched, and then summing the absolute value of the difference between the light emission data at each wavelength over the predetermined wavelength region, for example over i=200 to 800 nm, in accordance with equation (3) below.

$$PDC(n) = \sum_{i=200}^{800} |L(n)_i - L(n-1)_i| \qquad (3)$$

Furthermore, in step S34, the PDC data is differentiated, and it is judged whether or not the seasoning has been completed based on the derivative of the PDC data (the PDC differentiated value). Specifically, the point at which the derivative of the PDC data during the seasoning first changes sign from negative to positive is taken as the point at which the seasoning has been completed.

Figure 14:
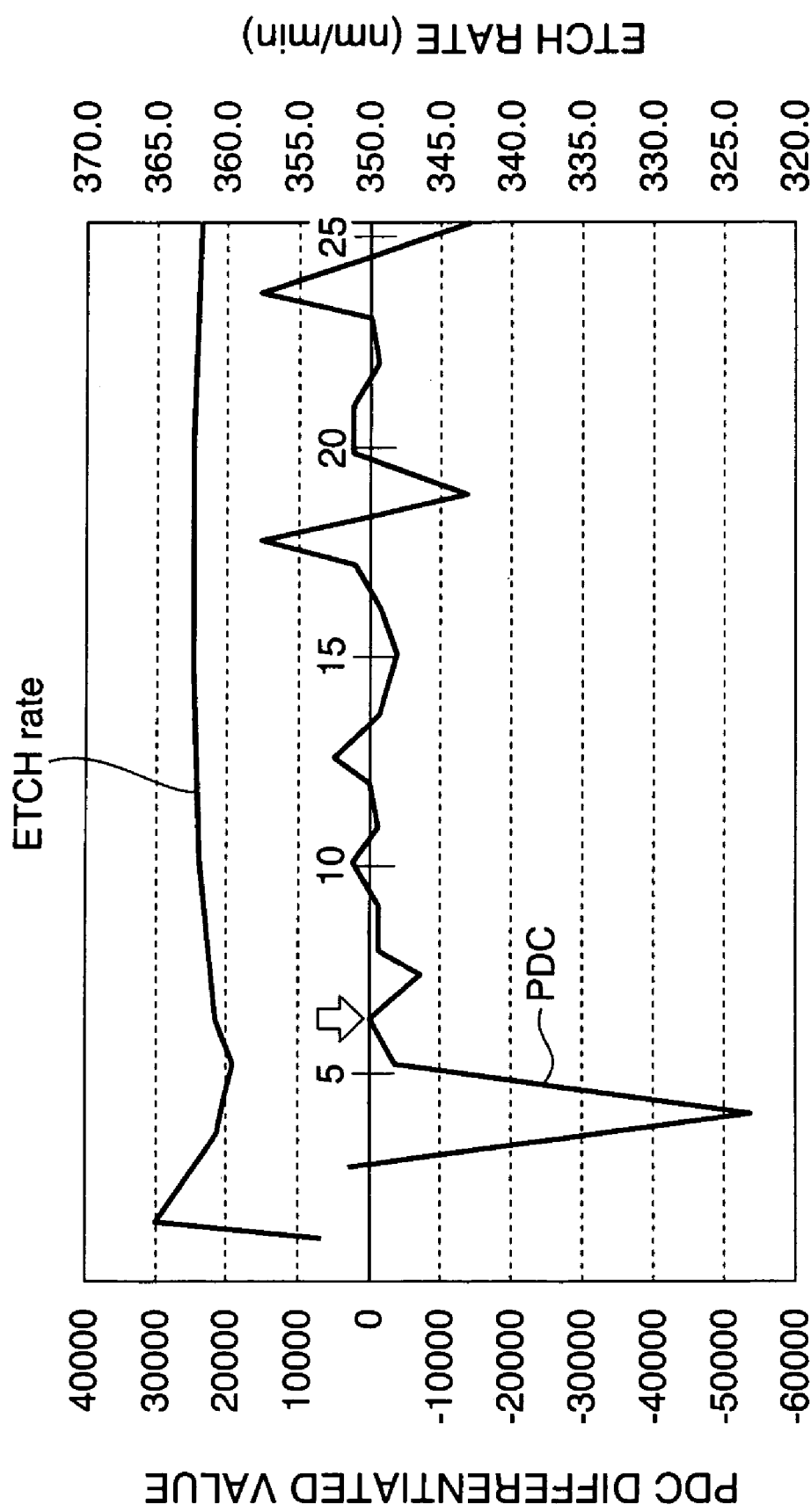
FIG. 14 is a graph showing the relationship between the derivative of the PDC data and an etch rate.

FIG. 14 is a graph showing the relationship between the derivative of the PDC data and the etch rate.

In FIG. 14, the axis of abscissas shows the number of dummy wafers processed in the seasoning, and the axis of ordinates shows the derivative of the PDC data on the left and the etch rate on the right.

As shown in FIG. 14, once six dummy wafers have been processed in the seasoning, the etch rate becomes stable, i.e. the atmosphere in the chamber 10 becomes stable; corresponding to this, as shown by the arrow in FIG. 14, the derivative of the PDC data first changes sign from negative to positive during the processing of the $6^{th}$ dummy wafer. It can thus be judged whether or not the atmosphere in the chamber 10 has become stable, and hence whether or not the seasoning has been completed, based on the derivative of the PDC data.

According to the seasoning step of step S34, it is judged whether or not the seasoning has been completed based on the difference in light emission data between two consecutively etched dummy wafers (PDC data). Once the state of plasma generation in the chamber becomes stable, the dummy wafer light emission data also becomes stable, and hence the difference in the light emission data between two consecutively etched dummy wafers becomes small. Judgment of when the seasoning has been completed can thus be carried out easily.

Moreover, according to the seasoning step of step S34, the derivative of the PDC data is calculated, and it is judged whether or not the seasoning has been completed based on the derivative. The derivative of the PDC data can decrease affection by the magnitude of variation of the light emission amount. The judgment of when the seasoning has been completed can thus be carried out more accurately.

It is to be understood that the object of the present invention can also be attained by supplying to a system or apparatus (e.g. the APC server) a storage medium storing program code of software that realizes the functions of the embodiment described above, and then causing a computer (or CPU, MPU, etc.) of the system or apparatus, or a controller connected to the apparatus, to read out and execute the program code stored in the storage medium.

In this case, the program code itself read out from the storage medium realizes the functions of the embodiment, and hence the program code and the storage medium storing the program code constitute the present invention.

The storage medium for supplying the program code may be, for example, a floppy (registered trademark) disk, a hard disk, a magnetic-optical disk, an optical disk such as a CD-ROM, a CD-R, a CD-RW, a DVD-ROM, a DVD-RAM, a DVD-RW, or a DVD+RW, a magnetic tape, a nonvolatile memory card, or a ROM. Alternatively, the program code may be downloaded via a network.

Moreover, it is to be understood that the functions of the embodiment described above can be realized not only by executing program code read out by a computer, but also by causing an OS (operating system) or the like operating on the computer to perform part or all of the actual processing based on instructions of the program code.

Furthermore, it is to be understood that the functions of the embodiment described above can also be realized by writing the program code read out from the storage medium into a memory provided on an expansion board inserted into the computer or in an expansion unit connected to the computer, and then causing a CPU or the like provided on the expansion board or in the expansion unit to perform part or all of the actual processing based on instructions of the program code.

In the embodiment described above, the APC server collects measured data or an apparatus log recorded by the control unit 57. However, as described above, the state of plasma generation in the chamber varies with the type of the P/C, and hence which apparatus log or measured data is closely related to the state of plasma generation in the chamber also varies depending on the type of the P/C.

To cope with this, in the present invention, it may be made to be such that the control unit or the like of each P/C has a list of which apparatus log or measured data is closely related to the state of plasma generation for that P/C, and when a given P/C is connected to the APC server, the APC server receives the list for that P/C, and collects an apparatus log or measured data based on the list. As a result, the APC server will not collect unnecessary apparatus logs or measured data, and hence the automatic setup process can be carried out quickly. Moreover, there is no need for the APC server to manage the lists, and hence the burden on the APC server can be reduced.

In the embodiment described above, component part installation defects and component part cleaning defects are detected in the abnormality judgment in the automatic setup process. However, the abnormal states detected are not limited to these, but rather, for example, it may also be detected whether or not there is an abnormal electrical discharge in the chamber 10, or whether or not there is leakage of helium gas from between the semiconductor wafer and the ESC 20.

In the embodiment described above, the case that the substrate processing apparatus is an etching apparatus has been described. However, substrate processing apparatuses to which the present invention can be applied are not limited thereto, but rather the substrate processing apparatus may be, for example, a coating/developing apparatus, a substrate cleaning apparatus, a heat treatment apparatus or a wet etching apparatus. Moreover, it is not necessary for the substrate processing apparatus to have both an upper electrode and a lower electrode.

Moreover, in the embodiment described above, the substrates processed are semiconductor wafers. However, the substrates processed are not limited thereto, but rather may be, for example, LCD (liquid crystal display) or FPD (flat panel display) glass substrates.

What is claimed is:

1. A method of resetting a substrate processing apparatus having a chamber, the method comprising:
    an evacuating step of evacuating the chamber;
    a temperature setting step of setting a temperature in the chamber;
    an abnormality judgment step of judging whether or not there is an abnormality in the chamber;
    a seasoning step of stabilizing an atmosphere in the chamber so as to conform to predetermined processing conditions; and
    a displaying step of displaying results judged in said abnormality judgment step,
    wherein:
        said abnormality judgment step comprises measuring at least one selected from data that change in response to a change in a state inside the chamber, and comparing the measured data with reference data that corresponds to the measured data for a normal state in the chamber; and
        in said temperature setting step, the temperature in the chamber is set to a temperature different from a temperature in the chamber during ordinary substrate processing.

2. A method as claimed in claim 1, wherein in said abnormality judgment step, a processing gas that does not cause production of a reaction product in the chamber is introduced while a substrate in the chamber is subjected to a predetermined process.

3. A method as claimed in claim 2, wherein the processing gas comprises only oxygen.

4. A method as claimed in claim 1, wherein the measured data comprises a log showing a state of at least one component part of the substrate processing apparatus.

5. A method as claimed in claim 4, wherein the log is of an impedance of a matcher that adjusts high-frequency electrical power applied to a lower electrode disposed in the chamber.

6. A method as claimed in claim 4, wherein the log is of a voltage between a lower electrode disposed in the chamber and a matcher that adjusts high-frequency electrical power applied to the lower electrode.

7. A method as claimed in claim 4, wherein the log is of an opening extent of a control valve that controls a pressure in the chamber.

8. A method as claimed in claim 1, wherein the measured data is processed substrate light emission data.

9. A method as claimed in claim 8, wherein the light emission data relates to a light intensity ratio.

10. A method as claimed in claim 1, wherein the measured data is data relating to a high-frequency power source that supplies high-frequency electrical power applied to a lower electrode disposed in the chamber.

11. A method as claimed in claim 1, wherein in said evacuating step, the temperature in the chamber is raised.

12. A method as claimed in claim 1, wherein in said seasoning step, stability of the atmosphere in the chamber is detected based on a difference in light emission data between two consecutively processed substrates.

13. A method as claimed in claim 12, wherein in said seasoning step, the stability of the atmosphere in the chamber is detected based on a derivative of the difference in the light emission data.

14. A method as claimed in claim 1, wherein in said abnormality judgment step, a leak in the chamber is detected based on a ratio of light emission amounts at different wavelengths for light emission from a processed substrate.

15. A computer-readable storage medium storing a program for causing a computer to implement a method of resetting a substrate processing apparatus having a chamber, the program comprising:
an evacuating module for evacuating the chamber;
a temperature setting module for setting a temperature in the chamber;
an abnormality judgment module for judging whether or not there is an abnormality in the chamber;
a seasoning module for stabilizing an atmosphere in the chamber so as to conform to predetermined processing conditions; and
a displaying module for displaying results judged by said abnormality judgment module,
wherein:
said abnormality judgment module measures at least one selected from data that change in response to a change in a state inside the chamber, and compares the measured data with reference data that corresponds to the measured data for a normal state in the chamber; and
said temperature setting module sets the temperature in the chamber to a temperature different from a temperature in the chamber during ordinary substrate processing.

16. A substrate processing apparatus comprising:
a chamber;
an evacuating device that evacuates said chamber;
a temperature setting device that sets a temperature in said chamber;
an abnormality judgment device that judges whether or not there is an abnormality in said chamber;
a seasoning device that stabilizes an atmosphere in said chamber so as to conform to predetermined processing conditions; and
a displaying device for displaying results judged by said abnormality judgment device,
wherein:
said abnormality judgment device measures at least one selected from data that change in response to a change in a state inside said chamber, and compares the measured data with reference data that corresponds to the measured data for a normal state in said chamber; and
said temperature setting device sets the temperature in the chamber to a temperature different from a temperature in the chamber during ordinary substrate processing.

* * * * *